United States Patent
Tryon et al.

(10) Patent No.: US 11,268,188 B2
(45) Date of Patent: Mar. 8, 2022

(54) ALUMINUM PHYSICAL VAPOR DEPOSITION FOR THE COSMETIC FINISHING OF RECYCLED ALUMINUM ALLOYS

(71) Applicant: Apple Inc., Cupertino, CA (US)

(72) Inventors: Brian S. Tryon, Redwood City, CA (US); Alexander W. Williams, Santa Clara, CA (US); James A. Curran, Morgan Hill, CA (US); Sonja R. Postak, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 155 days.

(21) Appl. No.: 16/519,288

(22) Filed: Jul. 23, 2019

(65) Prior Publication Data
US 2020/0347492 A1 Nov. 5, 2020

Related U.S. Application Data

(60) Provisional application No. 62/842,341, filed on May 2, 2019.

(51) Int. Cl.
*B32B 15/20* (2006.01)
*C23C 14/58* (2006.01)
(Continued)

(52) U.S. Cl.
CPC ........ *C23C 14/5853* (2013.01); *B32B 15/043* (2013.01); *B32B 15/20* (2013.01);
(Continued)

(58) Field of Classification Search
CPC ..... C23C 14/5853; C23C 14/18; C23C 14/20; C23C 14/14; C23C 14/0015; C23C 14/06;
(Continued)

(56) References Cited

U.S. PATENT DOCUMENTS

| | | | |
|---|---|---|---|
| 2017/0051426 A1* | 2/2017 | Curran | C25D 11/04 |
| 2017/0121836 A1* | 5/2017 | Tatebe | C25F 3/20 |
| 2018/0073159 A1* | 3/2018 | Curran | C25D 11/26 |

FOREIGN PATENT DOCUMENTS

| | | | | |
|---|---|---|---|---|
| CN | 101831615 A | * | 9/2010 | ............. C23C 14/06 |
| EP | 2130949 A1 | | 12/2009 | |
| KR | 101433090 B1 | * | 8/2014 | ............. B29C 33/38 |

OTHER PUBLICATIONS

A.C. Hall et al. "Preparation of Aluminum Coatings Containing Homogenous Nanocrystalline Microstructures Using the Cold Spray Process" 2008, Journal of Thermal Spray Technology, 17(3), p. 352-359. (Year: 2008).*

(Continued)

*Primary Examiner* — Humera N. Sheikh
*Assistant Examiner* — John D Schneible
(74) *Attorney, Agent, or Firm* — Dorsey & Whitney LLP

(57) ABSTRACT

A method of forming a surface coating on a component of an electronic device can include depositing an aluminum layer including at least about 0.05 weight percent (wt %) of a grain refiner on a surface of the component by a physical (Continued)

vapor deposition process, and anodizing the aluminum layer to form an anodized aluminum oxide layer having a L* value greater than about 85 in the CIELAB color space.

14 Claims, 14 Drawing Sheets

(51) Int. Cl.
| | |
|---|---|
| *B32B 15/04* | (2006.01) |
| *C23C 14/20* | (2006.01) |
| *C23C 14/18* | (2006.01) |
| C23C 14/06 | (2006.01) |
| C23C 14/14 | (2006.01) |
| C23C 28/00 | (2006.01) |
| C23C 14/00 | (2006.01) |
| B32B 18/00 | (2006.01) |
| C23C 14/08 | (2006.01) |

(52) U.S. Cl.
CPC .............. *C23C 14/18* (2013.01); *C23C 14/20* (2013.01); *B32B 18/00* (2013.01); *B32B 2255/06* (2013.01); *B32B 2255/205* (2013.01); *C23C 14/0015* (2013.01); *C23C 14/06* (2013.01); *C23C 14/08* (2013.01); *C23C 14/083* (2013.01); *C23C 14/14* (2013.01); *C23C 28/00* (2013.01); *C23C 28/3455* (2013.01)

(58) Field of Classification Search
CPC ....... C23C 14/08; C23C 14/083; C23C 28/00; C23C 28/3455; B32B 15/043; B32B 15/20; B32B 2255/06; B32B 2255/205; B32B 18/00
USPC .......................................................... 428/472
See application file for complete search history.

(56) References Cited

OTHER PUBLICATIONS

R.D. Hilty et al. "On the Formation of Lightweight Nanocrystalline Aluminum Alloys by Electrodeposition" 2017, The Minerals, Metals, & Materials Society, 69(12), p. 2621-2625. (Year: 2017).*
C. Zhu et al. "Effect of 2024 Al Alloy Insert on the Grain Refinement of a 2024 Al Alloy Prepared via Insert Mold Casting" 2019, Metals, 9(1126), p. 1-10. (Year: 2019).*
V.C. Gudla, "In-situ TEM investigation of microstructural evolution in magnetron sputtered Al—Zr and Al—Zr—Si coatings during heat treatment" 2015, Materials and Design, 89, p. 1071-1078. (Year: 2015).*
Clouet, Emmanuel et al., "Precipitation Kinetics of $Al_3Zr$ and $Al_3Sc$ in Aluminum Alloys Modeled with Cluster Dynamics", Acta Materialia 53, Mar. 17, 2005, pp. 2313-2325.
Egorova, A. et al., "On the Relation Between Plasma Power and Aging Treatment in the Production of Thin Aluminum Zirconium Foils by Magnetron Sputtering", Materials Science & Engineering Technology, vol. 47, Issue 11, Nov. 17, 2016, pp. 989-996.
Kovac, Julien et al., "Tensile Properties of Magnetron Sputtered Aluminum-Scandium and Aluminum-Zirconium Thin Films: A Comparative Study", Surface and Coatings Technology, vol. 215, Jan. 25, 2013, pp. 369-375.
Ma, Bingyang et al., "The Solid Solution Strengthening in Al—Zr Nanocrystalline Alloy Films", Surface and Coatings Technology, vol. 321, Jul. 15, 2017, pp. 52-56.
Toenjes, Anastasiya et al., "Process Chain for the Fabrication of Hardenable Aluminium-Zirconium Micro-Components by Deep Drawing", MATEC Web of Conferences 190, 15013, ICNFT 2018, available at https://doi.org/10.1051/matecconf/201819015013, 2018, (8 pages).

* cited by examiner

ALUMINUM PHYSICAL VAPOR DEPOSITION FOR THE COSMETIC FINISHING OF RECYCLED ALUMINUM ALLOYS

CROSS-REFERENCE TO RELATED APPLICATION(S)

This claims priority to U.S. Provisional Patent Application No. 62/842,341, filed 2 May 2019, and entitled "ALUMINUM PHYSICAL VAPOR DEPOSITION FOR THE COSMETIC FINISHING OF RECYCLED ALUMINUM ALLOYS," the entire disclosure of which is hereby incorporated by reference.

FIELD

The present disclosure relates generally to surface coatings. More particularly, the present disclosure relates to anodized and anodizable surface coatings.

BACKGROUND

The increasing performance of electronic devices, such as handheld phones, tablet computers, laptops, and watches has driven a demand to design and produce components for these devices that have a desired level of performance, while maintaining a reasonable cost. In order to achieve this level of performance, it can be desirable for a component of an electronic device, such as an external housing, to have certain material properties, such as, being light weight, low in cost, and high in strength. While various materials can be selected to achieve these desired properties, these materials often do not have an acceptable cosmetic appearance.

Traditional methods for modifying the surface finish, and thus cosmetic appearance, of electronic device components can be time-consuming and expensive. Other methods of modifying the surface finish of electronic device components often do not have a desired level of durability to withstand everyday use without degrading or being physically removed from the component. Accordingly, it is desirable to provide methods of modifying the surface finish of electronic device components to achieve an acceptable cosmetic appearance, regardless of the material the component is formed from.

SUMMARY

According to one aspect of the present disclosure, a component for an electronic device can include a substrate material defining a surface, and an anodized aluminum oxide layer formed over the surface, the anodized aluminum oxide layer having a thickness greater than about 4 microns, and an L* value in a CIELAB color space of greater than about 85.

In some examples, the substrate material can be a first material and the anodized aluminum oxide layer can be formed from a second material different than the first material. The first material can be an aluminum alloy. The component can further include a stop layer having a thickness of less than about 1 micron disposed between the substrate material and the anodized aluminum oxide layer, the stop layer including titanium, platinum group metals, or a conductive oxide material. The component can further include an aluminum layer disposed between the anodized aluminum oxide layer and the substrate, the aluminum layer having a thickness of less than about 100 microns and including at least about 0.05 weight percent (wt %) of a grain refiner, wherein the anodized aluminum oxide layer is formed from the aluminum layer. The anodized aluminum oxide layer can have a b* value in the CIELAB color space of between about −0.04 and about 0.4. The surface can be a three-dimensional surface. The anodized aluminum oxide layer can have a thickness of less than about 200 microns.

According to some aspects of the present disclosure, a coating formed on a substrate material can include an aluminum layer having a surface area ratio of grains with a major surface dimension greater than 1 micron to grains with a major surface dimension less than 1 micron of less than about 0.1, the aluminum layer having a thickness greater than about 2 microns.

In some examples, the aluminum layer can have a thickness of less than about 100 microns. The surface area ratio can be less than about 0.07. The surface area ratio can be less than about 0.05. The aluminum layer can include greater than about 0.05 weight percent (wt %) of a grain refiner. The grain refiner can include at least one of zirconium, scandium, silicon, or silver.

According to some aspects of the present disclosure, a method of coating a substrate can include depositing an aluminum layer including at least about 0.05 weight percent (wt %) of a grain refiner on a surface of the substrate by a physical vapor deposition process, and anodizing the aluminum layer to form an anodized aluminum oxide layer.

In some examples, the method can further include depositing a stop layer having a thickness of less than about 1 micron on the surface of the substrate prior to depositing the aluminum layer, the stop layer including titanium, a platinum group metal, or a conductive oxide material. The method can further include at least one of blasting, polishing, or machining the aluminum layer prior to anodizing the aluminum layer. The aluminum layer can have a surface area ratio of grains with a major surface dimension greater than 1 micron to grains with a major surface dimension less than 1 micron of less than about 0.1. The anodized aluminum oxide layer can have a thickness of greater than about 4 microns. The grain refiner can include at least one of zirconium, scandium, silicon, or silver.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
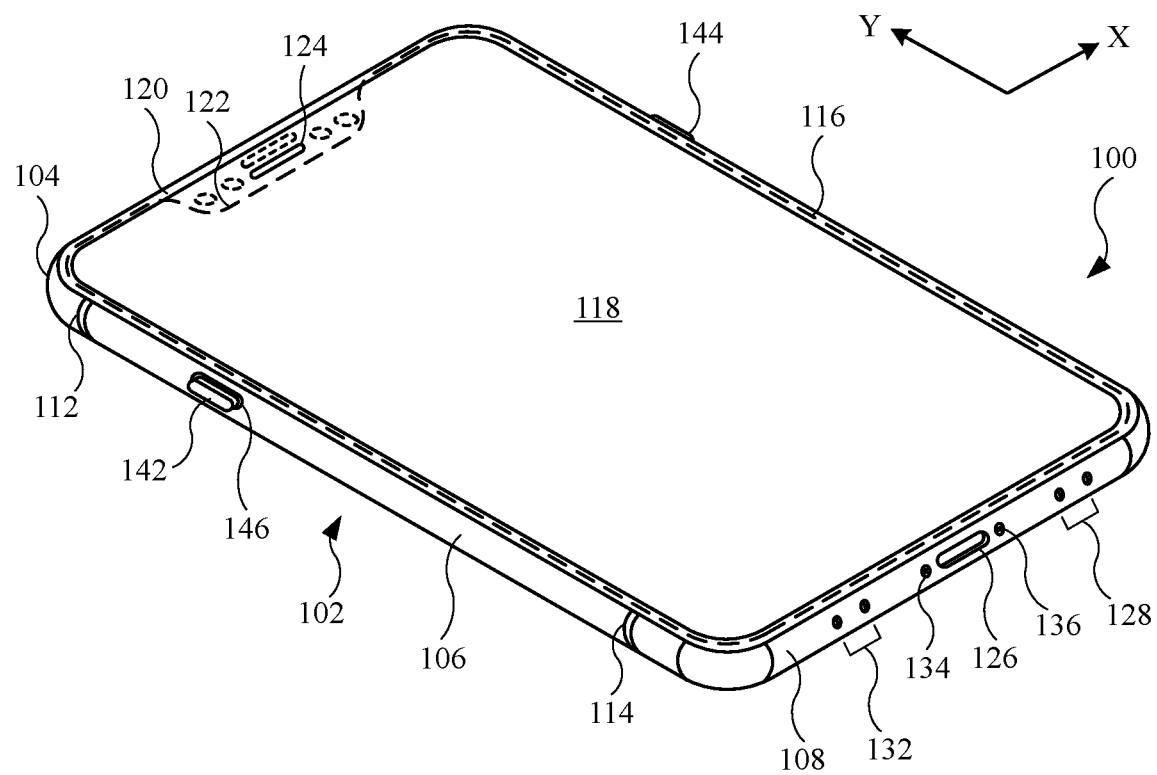
FIG. 1 shows a perspective view of an electronic device.

The present description provides examples, and is not limiting of the scope, applicability, or configuration set forth in the claims. Thus, it will be understood that changes can be made in the function and arrangement of elements discussed without departing from the spirit and scope of the disclosure, and various examples can omit, substitute, or add other procedures or components, as appropriate. For instance, methods described can be performed in an order different from that described, and various steps can be added, omitted, or combined. Also, features described with respect to some examples can be combined in other examples.

One aspect of the present disclosure relates to an aluminum coating for a component of an electronic device, such as a housing. The component can include substantially any conductive material, and the coating can include an aluminum layer deposited on a surface of the component by a physical vapor deposition (PVD) process. The aluminum layer can have a thickness greater than about 2 microns and less than about 100 microns. The aluminum layer can also include greater than about 0.05 weight percent (wt %) of a grain refiner, such as zirconium. The parameters of the deposition process and the presence of the grain refiner can result in the aluminum layer having a surface area ratio of grains with a major surface dimension greater than 1 micron to grains with a major surface dimension less than 1 micron of less than about 0.1. After the coating has been deposited, it can be anodized to form an anodized aluminum oxide layer having a desired cosmetic appearance. For example, the anodized aluminum oxide layer can have an L* value greater than about 85, an a* value of about 3, and a b* value greater than about −4 and less than about 4 in the CIELAB color space.

In some examples, it can be desirable for components of an electronic device to have certain material properties, such as low cost, high strength, light weight, and machinability. The ability to form components from materials that have these desired properties can allow for increased device performance, reduced manufacturing costs and time, as well as increased device durability. It is also desirable, however, for certain components of an electronic device, such as components that define a portion of the exterior surface of the device, to have a cosmetic appearance that is pleasing to a user. In some examples, the materials that allow for a desired level of component performance do not typically achieve a desired surface finish or appearance with traditional finishing processes and techniques.

Accordingly, the methods, compositions, and components described herein can provide a desired surface finish and cosmetic appearance on a surface of a component including a wide range of materials. In some examples, the present disclosure can enable a desired surface finish, for example having a desired color in the CIELAB color space, to be achieved on a component including substantially any conductive material. In some examples, this desired surface finish can be achieved by depositing an aluminum layer on a surface of the component by a physical vapor deposition process, and then anodizing the aluminum layer to achieve the desired appearance.

In order to achieve a desired appearance by anodization, it is desirable that the aluminum layer have certain structural and material properties. Anodization is a process that can form and/or increase the thickness of the natural aluminum oxide surface layer of a deposited aluminum layer, and that can consume the deposited aluminum layer in the process. Accordingly, the properties of the anodized aluminum oxide layer can depend on the thickness and microstructure of the deposited aluminum layer. In order to achieve a desired surface finish through anodization it is desirable that the deposited aluminum layer have certain properties. For example, as described further herein, it can desirable for the aluminum layer to have a lateral density greater than about 98% and to include grains that are mostly smaller than about 1 micron. It can also be desirable for the aluminum layer to have a thickness greater than about 2 microns so that there is enough material to form an anodized aluminum oxide layer of a desired thickness. In some examples, a dense aluminum layer including small grains can allow for an anodization process to form an anodized aluminum oxide layer that has a uniform appearance and a desired color.

Traditional methods of depositing aluminum, for example by traditional physical vapor deposition processes, are typically not able to achieve aluminum layers having such a desired thickness and microstructure. Traditional aluminum physical vapor deposition processes can form aluminum films that include grains significantly larger than desired, or that do not achieve a desired level of lateral density on a wide range of desirable substrate materials. Accordingly, when these aluminum layers are anodized, the resultant anodized aluminum oxide layer often does not achieve a desired color and/or can have an irregular or non-uniform appearance.

In some examples, an aluminum layer deposited by a physical vapor deposition process as described herein, can include an amount of a grain refiner and can have a thickness and microstructure as desired. The inclusion of a grain refiner in the aluminum layer can promote the growth of an aluminum layer or film having grains with a desired size and size distribution, as well as having a desired level of lateral density to thereby enable anodization, as described herein. In some examples, a grain refiner can include elements such as zirconium, scandium, silicon, and silver. The deposited aluminum layer can have greater than about 0.05 weight percent (wt %) of one or more grain refiners, for example about 0.4 wt %.

As discussed herein, the anodization of a deposited aluminum layer is a process that converts the deposited aluminum to aluminum oxide. Typically, a deposited aluminum layer can have a thin surface layer of naturally occurring aluminum oxide. An anodization process can increase the thickness of such a layer by consuming, or converting to aluminum oxide, the aluminum that is directly below and in contact with the oxide layer. Accordingly, an unchecked anodization process can gradually oxidize the deposited aluminum until the entire thickness of the layer has been converted to aluminum oxide. Further, certain substrate materials can be susceptible to this oxidation process. Accordingly, the anodization process can be controlled to oxidize a desired thickness of the deposited aluminum layer without oxidizing the underlying substrate, which can lead to, for example, layer delamination.

In some examples, however, the deposition of a stop layer on the substrate or component surface prior to depositing the aluminum layer can act as a barrier to the anodization process, thereby preventing oxidation of the underlying material. Such a stop layer can allow for the substantially full anodization of the deposited aluminum layer without the expense or effort associated with the careful control and monitoring of the typical anodization process to prevent substrate oxidation. Thus, in some examples, the processes described herein can include the deposition of a stop layer underlying a deposited aluminum layer. The stop layer can include titanium, platinum group metals, or conductive oxide materials. In some examples, the stop layer can have any desired thickness, for example, about 1 micron. In some examples, the stop layer can have a thickness of less than about 100 nm, for example less than about 75 nm, less than about 50 nm, or less than about 25 nm, or even thinner. In some examples, the stop layer can have a thickness of less than about 1 microns, for example, less than about 750 nm, less than about 500 nm, less than about 250 nm, less than about 200 nm, or less than about 100 nm, or even thinner. In some examples, the thickness of the stop layer can be selected to maintain at least some un-anodized material under anodizing conditions for several minutes or more. In some examples, the thickness of the stop layer can be designed to give a specific color or hue in the CIELAB color space for the final anodized layer, as desired.

These and other examples are discussed below with reference to FIGS. 1-14. The detailed description provided herein with respect to these figures, however, is for explanatory purposes only and should not be construed as limiting.

FIG. 1 illustrates a perspective view of an example of an electronic device 100. The electronic device 100 shown in FIG. 1 is a mobile wireless communication device, such as a smartphone. The smartphone of FIG. 1 is merely one representative example of a device that can be used in conjunction with the systems and methods disclosed herein. Electronic device 100 can correspond to any form of wearable electronic device, a portable media player, a media storage device, a portable digital assistant ("PDA"), a tablet computer, a computer, a mobile communication device, a GPS unit, a remote-control device, or any other electronic device. The electronic device 100 can be referred to as an electronic device, or a consumer device.

The electronic device 100 can have a housing that includes a frame or a band 102 that defines an outer perimeter and a portion of the exterior surface of the electronic device 100. The band 102, or portions thereof, can be joined to one or more other components of the device as described herein. In some examples, the band 102 can include several sidewall components, such as a first sidewall component 104, a second sidewall component 106, a third sidewall component 108 (opposite the first sidewall component 104), and a fourth sidewall component (not shown in FIG. 1). The aforementioned sidewall components can be joined, for example at multiple locations, to one or more other components of the device as described herein. The exterior surface or surfaces defined by the housing, including the surfaces of the band 102 can include a surface coating or surface finish as described herein, such as an anodized aluminum oxide surface coating.

In some instances, some of the sidewall components form part of an antenna assembly (not shown in FIG. 1). As a result, a non-metal material or materials can separate the sidewall components of the band 102 from each other, in order to electrically isolate the sidewall components. For example, a first separating material 112 separates the first sidewall component 104 from the second sidewall component 106, and a second separating material 114 separates the second sidewall component 106 from the third sidewall component 108. The aforementioned materials can include an electrically inert or insulating material(s), such as plastics and/or resin, as non-limiting examples. Further, as described herein, one or more of the sidewall components can be electrically connected to internal components of the electronic device, such as a support plate, as described herein. In some examples, these electrical connections can be achieved by joining a sidewall component to an internal component, for example, as part of the antenna assembly.

The electronic device 100 can further include a display assembly 116 (shown as a dotted line) that is covered by a protective cover 118. The display assembly 116 can include multiple layers (discussed below), with each layer providing a unique function. The display assembly 116 can be partially covered by a border 120 or a frame that extends along an outer edge of the protective cover 118 and partially covers an outer edge of the display assembly 116. The border 120 can be positioned to hide or obscure any electrical and/or mechanical connections between the layers of the display assembly 116 and flexible circuit connectors. Also, the border 120 can include a uniform thickness. For example, the border 120 can include a thickness that generally does not change in the X- and Y-dimensions.

Also, as shown in FIG. 1, the display assembly 116 can include a notch 122, representing an absence of the display assembly 116. The notch 122 can allow for a vision system that provides the electronic device 100 with information for object recognition, such as facial recognition. In this regard, the electronic device 100 can include a masking layer with openings (shown as dotted lines) designed to hide or obscure the vision system, while the openings allow the vision system to provide object recognition information. The protective cover 118 can be formed from a transparent material, such as glass, plastic, sapphire, or the like. In this regard, the protective cover 118 can be referred to as a transparent cover, a transparent protective cover, or a cover glass (even though the protective cover 118 sometimes does not include glass material). As shown in FIG. 1, the protective cover 118 includes an opening 124, which can represent a single opening of the protective cover 118. The opening 124 can allow for transmission of acoustical energy (in the form of audible sound) into the electronic device 100, which can be received by a microphone (not shown in FIG. 1) of the electronic device 100. The opening 124 can also, or alternatively, allow for transmission of acoustical energy (in the form of audible sound) out of the electronic device 100, which can be generated by an audio module (not shown in FIG. 1) of the electronic device 100.

The electronic device 100 can further include a port 126 designed to receive a connector of a cable assembly. The port 126 allows the electronic device 100 to communicate data (send and receive), and also allows the electronic device 100 to receive electrical energy to charge a battery assembly. Accordingly, the port 126 can include terminals that electrically couple to the connector.

Also, the electronic device 100 can include several additional openings. For example, the electronic device 100 can include openings 128 that allow an additional audio module (not shown in FIG. 1) of the electronic device to emit acoustical energy out of the electronic device 100. The electronic device 100 can further include openings 132 that allow an additional microphone of the electronic device to receive acoustical energy. Furthermore, the electronic device 100 can include a first fastener 134 and a second fastener 136 designed to securely engage with a rail that is coupled to the protective cover 118. In this regard, the first fastener 134 and the second fastener 136 are designed to couple the protective cover 118 with the band 102.

The electronic device 100 can include several control inputs designed to facilitate transmission of a command to the electronic device 100. For example, the electronic device 100 can include a first control input 142 and a second control input 144. The aforementioned control inputs can be used to adjust the visual information presented on the display assembly 116 or the volume of acoustical energy output by an audio module, as non-limiting examples. The controls can include one of a switch or a button designed to generate a command or a signal that is received by a processor. The control inputs can at least partially extend through openings in the sidewall components. For example, the second sidewall component 106 can include an opening 146 that receives the first control input 142. Further details regarding the features and structure of an electronic device are provided below, with reference to FIG. 2.

Figure 2:
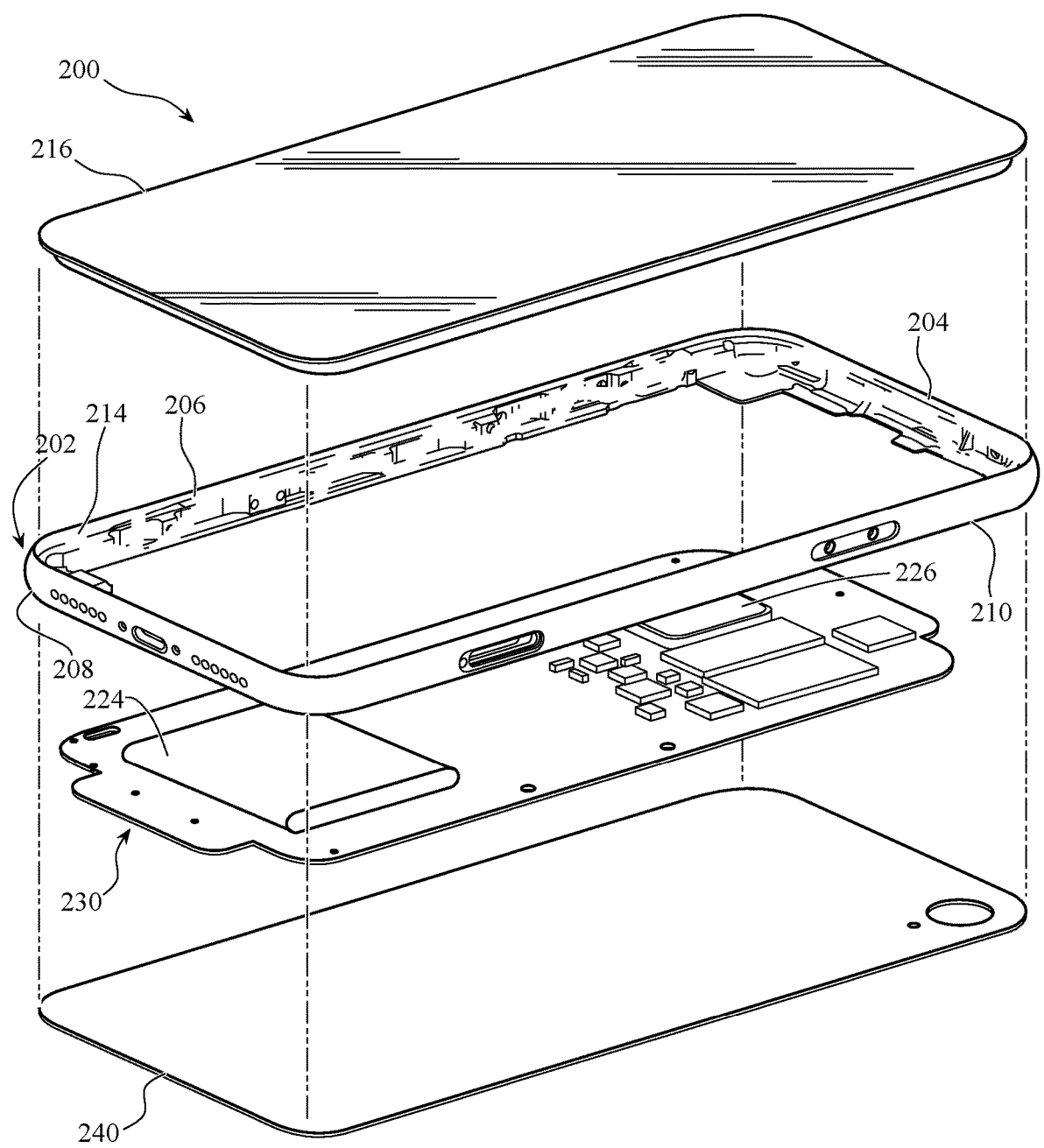
FIG. 2 shows an exploded view of the electronic device.

FIG. 2 illustrates an exploded view of an electronic device 200. The electronic device 200 shown in FIG. 2 is a smartphone, but is merely one representative example of a device that can include or be used with the systems and methods described herein. As described with respect to electronic device 100, electronic device 200 can correspond to any form of wearable electronic device, a portable media player, a media storage device, a portable digital assistant ("PDA"), a tablet computer, a computer, a mobile communication device, a GPS unit, a remote-control device, and other similar electronic devices. In some examples, the electronic device 200 can include some or all of the features described herein with respect to electronic device 100.

The electronic device can have a housing that includes a band 202 that at least partially defines an exterior portion, such as an outer perimeter, of the electronic device. As with the band 102 described above in FIG. 1, the band 202 can include several sidewall components, such as a first sidewall component 204, a second sidewall component 206, a third sidewall component 208 (opposite the first sidewall component 204), and a fourth sidewall component 210. The band 202 can also include a non-metal material or materials that separate and/or join the sidewall components of the band 202 with each other, as described herein. For example, separating material 214 can separate and/or join the second sidewall component 206 with the third sidewall component 208.

The housing, including the band 202, can include one or more features to receive or couple to other components of the device 200. For example, the band 202 can include any number of features such as apertures, cavities, indentations, and other mating features to receive and/or attach to one or more components of the device 200. The electronic device 200 can include internal components such as processors, memory, circuit boards, batteries, and sensors. Such components can be disposed within an internal volume defined, at least partially, by the band 202, and can be affixed to the band 202, via internal surfaces, attachment features, threaded connectors, studs, posts, and/or other fixing features, that are formed into, defined by, or otherwise part of the band 202.

The device 200 can include internal components, such as a system in package (SiP) 226, including one or more integrated circuits such as a processors, sensors, and memory. The device 200 can also include a battery 224 housed in the internal volume of the device 200. The device 200 can also include one or more sensors, such as optical or other sensors, that can sense or otherwise detect information regarding the environment exterior to the internal volume of the device 200. Additional components, such as a haptic engine, can also be included in the device 200. The electronic device 200 can also include a display assembly 216, similar to display assembly 116, described herein. In some examples, the display assembly 216 can be received by and/or be attached to the band 202 by one or more attachment features. In some examples, one or more of these internal components can be mounted to a circuit board 220. The electronic device 200 can further include a support plate 230, also referred to as a back plate or chassis, that can provide structural support for the electronic device 200. The support plate 230 can include a rigid material, such as a metal or metals.

An exterior surface of the electronic device 200 can further be defined by a back cover 240 that can be coupled to one or more other components of the device 200. In this regard, the back cover 240 can combine with the band 202 to form an enclosure or housing of the electronic device 200 with the enclosure or housing (including band 202 and back cover 240) at least partially defining an internal volume and an exterior surface. The back cover 240 can include a transparent material such as glass, plastic, sapphire, or the like. In some examples, the back cover 240 can be a conductive transparent material, such as indium titanium oxide or a conductive silica. The exterior surface or surfaces defined by the housing, including the surfaces of the band 202 and/or the back cover 240, can include a surface coating or surface finish as described herein. As such, the band 202 and back cover 240 can be formed from any number of conductive materials as desired as and as described further herein, while the surface coating provides a desired cosmetic finish to the exterior surfaces of the device 200. In some examples, other components, such as internal components of the electronic device 200, for example a support plate 230, can also include a surface coating as described herein. In some examples, such a surface coating cannot only provide a desired appearance but can serve other functions as desired. Further details regarding coating a component of an electronic device are provided below with reference to FIG. 3.

Figure 3:
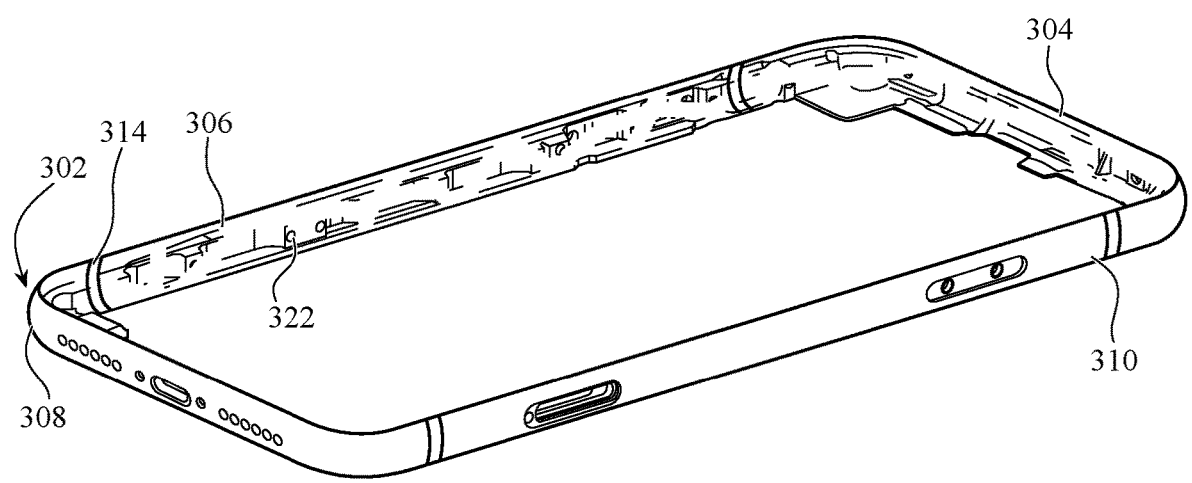
FIG. 3 shows a perspective view of a component of the electronic device.

FIG. 3 illustrates a component 300 of an electronic device. The electronic device can be a smartphone, and can include any of the features of devices 100 and 200, as described with respect to FIGS. 1 and 2. The component 300 can be a band 300 of a smartphone, similar to band 102 and band 202 described with respect to FIGS. 1 and 2. As with bands 102, 202, the band 300 can include several sidewall components, 304, 306, 308, and 310. The band 300 can include or be formed from a conductive material, for example a metallic material, such as aluminum, titanium, or stainless steel. For example, the sidewall components 304, 306, 308, 310 forming the band 300 can include an aluminum alloy, for example a recycled aluminum alloy, such as a recycled 6063 aluminum alloy. The band 300 and the sidewall components 304, 306, 308, 310 can include an anodized surface coating as described herein and can have a desired cosmetic appearance. In some examples, the surface coating can be formed according to the processes described herein on at least the surfaces of the band 300 that define an exterior surface of the electronic device. In some examples, the surface coating can be formed on an entire surface of the band 300.

Accordingly, an electronic device including the band 300 can have a desired cosmetic appearance, for example as achieved by the surface coating described herein, while including materials that cannot otherwise be able to achieve such a surface finish. Further, in some examples, multiple components, such as one or more of the sidewall components 304, 306, 308, and 310 can be formed from different materials but can have a substantially indistinguishable surface finish to a user because of the surface coating formed thereon by the processed described herein.

Any number or variety of electronic device components can include a surface coating, as described herein. The process for forming such a surface coating can include a physical vapor deposition process to deposit and aluminum layer on a surface of the component and anodizing the aluminum layer as described herein. An aluminum layer and surface coating as described herein, can be formed not only on the specific components and substrates described herein, but on any number of components in any combination. Various examples of aluminum layers, surface coatings, and processes for forming the same are described below with reference to FIGS. 4 and 5.

Figure 4:
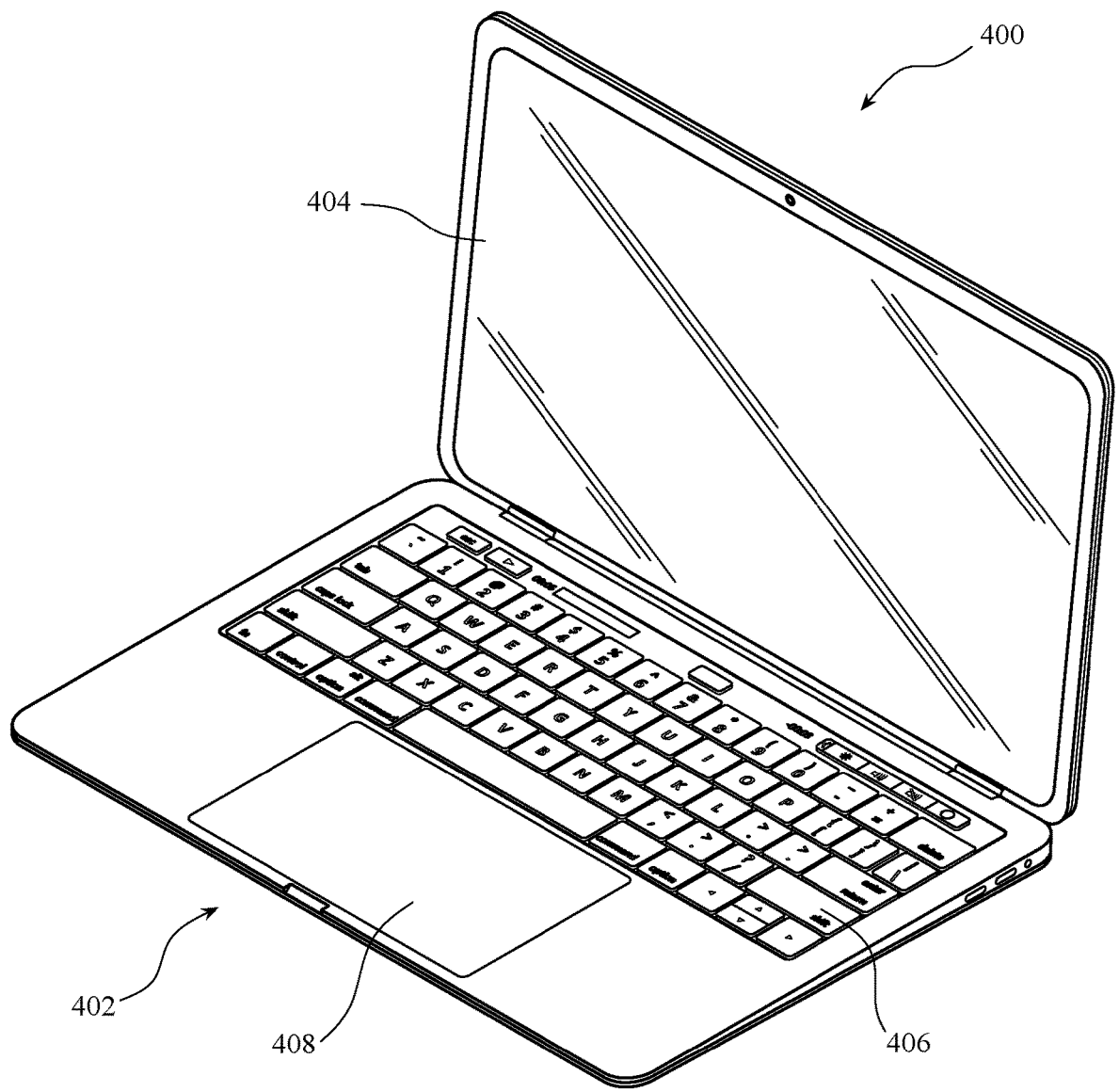
FIG. 4 shows a perspective view of an electronic device.

FIG. 4 shows another electronic device 400. The electronic device shown in FIG. 4 is a laptop computer. As with electronic devices 100 and 200 discussed herein, the laptop computer 400 of FIG. 4 is merely one representative example of a device that can be used in conjunction with the systems and methods disclosed herein. Electronic device 400 can correspond to any form of electronic device, such as a wearable electronic device, a portable media player, a media storage device, a portable digital assistant ("PDA"), a tablet computer, a computer, a mobile communication device, a GPS unit, or a remote-control device. The electronic device 400 can be referred to as an electronic device, or a consumer device. The electronic device 400 can have an exterior housing 402, a display 404, and input components 406, 408. Further details of the electronic device 400 are provided below with reference to FIG. 5.

Figure 5:
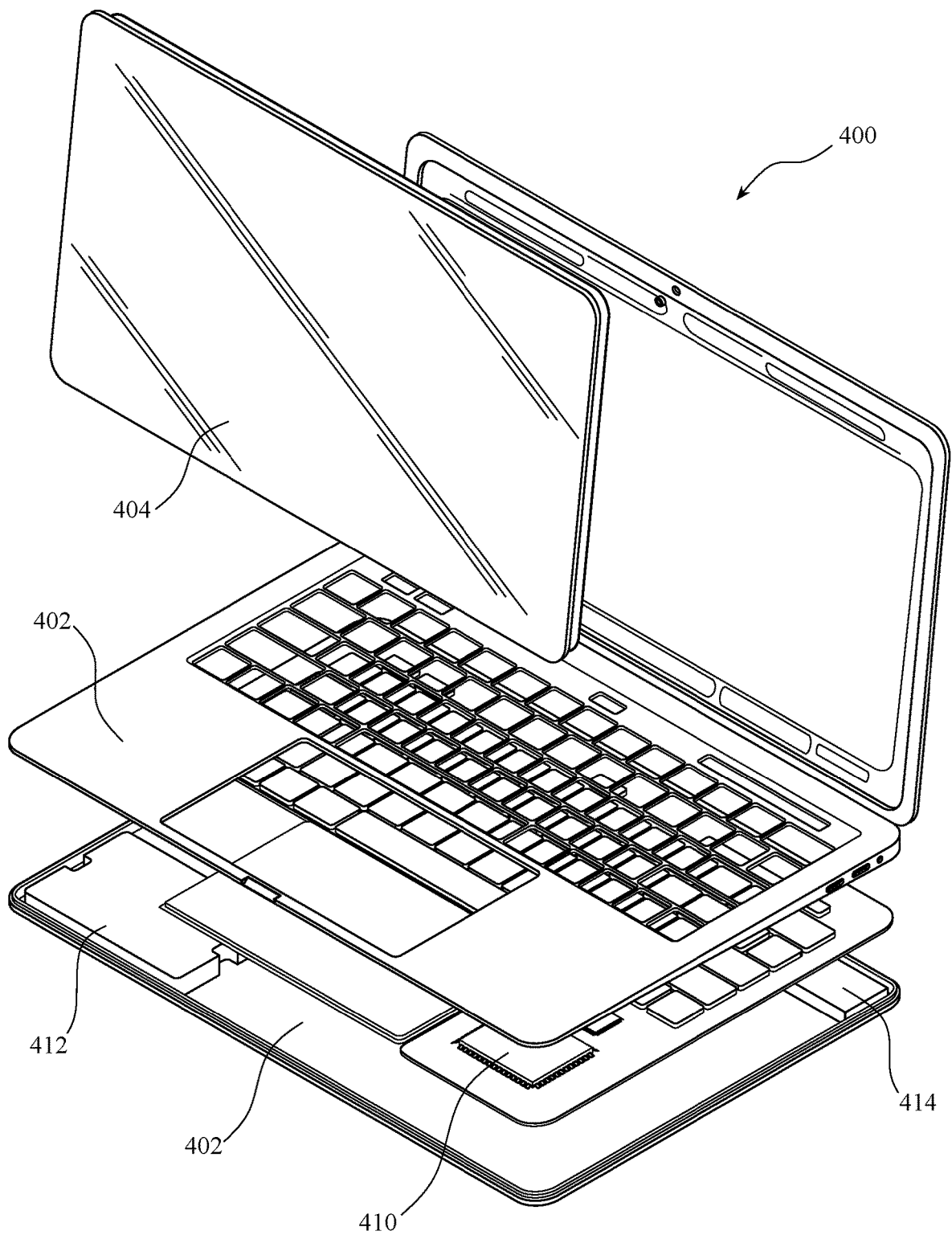
FIG. 5 shows an exploded view of the electronic device.

Referring now to FIG. 5, the electronic device 400 can include a housing 402 that at least partially defines an exterior surface of the device 400. The device 400 can also include internal components, such as processors 410, memory, circuit boards, batteries 412, sensors 414, speakers, and other internal computing components. Such components can be disposed within an internal volume defined at least partially by the housing 402, and can be affixed to the housing 402 via internal surfaces, attachment features, threaded connectors, studs, posts, and/or other features, that are formed into, extending into the body from, or otherwise part of the housing 402.

As with the housings of electronic devices 100 and 200, the housing 402 can be formed from substantially any conductive material, as described herein, such as a metallic material, and can include an anodized surface coating formed according to the processes described herein. Thus, in some examples, the housing 402 can have a desired cosmetic appearance, and can be a desired color or range of colors in the CIELAB color space. Additionally, other components of the electronic device 400 can include a surface coating, as described herein. In some examples, an anodized surface coating can be disposed on substantially an entire exterior surface of a component, such as the housing 402. Accordingly, the surface on which the coating is formed can be a three-dimensional surface. That is, the coating can be formed on a surface that is not merely planar and that can include curves, protrusions, folds, corners, bends, or any other three-dimensional features. In some cases, a three-dimensional surface can be a surface that has an amount of curvature, or is non-planer in two or more orientations.

Any number or variety of electronic device components can include a surface coating, as described herein. The process for forming such a surface coating can include a physical vapor deposition process to deposit and aluminum layer on a surface of the component, and anodizing the aluminum layer as described herein. An aluminum layer and a surface coating, as described herein, can be formed not only on the specific components and substrates described herein, but on any number of components in any combination. Various examples of aluminum layers, surface coatings, and processes for forming the same are described below with reference to FIGS. 6-9.

Figure 6:
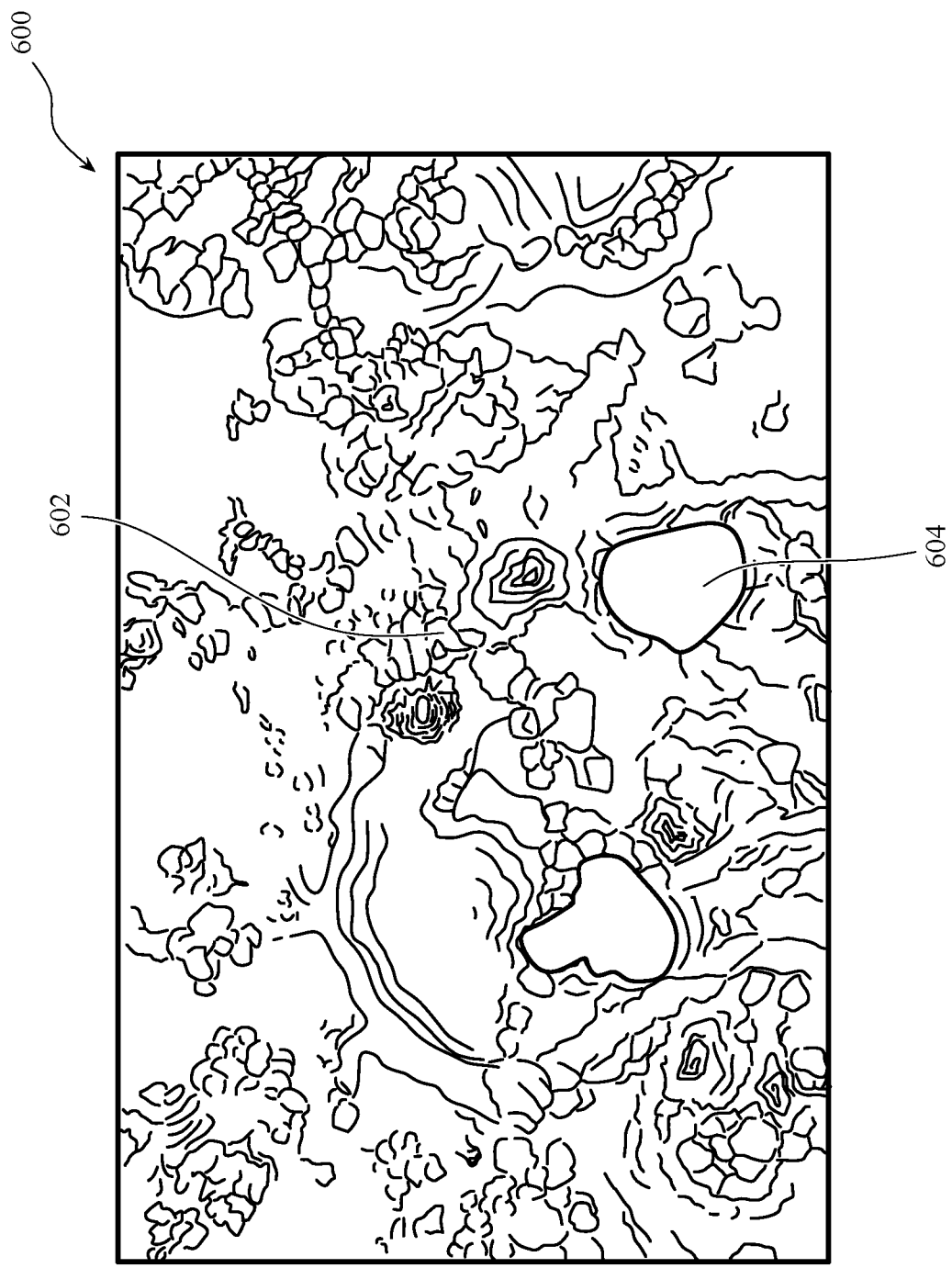
FIG. 6 illustrates the surface of a deposited aluminum layer.

FIG. 6 illustrates a view of a top surface of an aluminum layer or coating 600 formed on a substrate by a physical vapor deposition process, as described herein. As shown, the substrate can include a component for an electronic device, such as bands 102, 202, and 300. Physical vapor deposition processes generally involve the transition of a coating material or materials from a solid or liquid condensed phase to a vapor phase, whereupon the material or materials are condensed on the surface of a substrate in a reaction chamber. In some examples, the reaction chamber can have an internal pressure substantially below atmospheric pressure during the condensation or deposition process. As used herein, the term physical vapor deposition process can be used to refer to a variety of process based on the principle discussed above. For example, the term physical vapor deposition process can refer to evaporative deposition processes, sputter deposition processes, such as magnetron sputtering, electron beam physical vapor deposition processes, cathodic arc deposition processes, pulsed laser deposition processes, and other appropriate deposition processes.

The aluminum layer 600 can include a number of crystal grains 602, 604. As used herein, the term major surface dimension refers to the largest lateral dimension of a grain measured at the surface of a layer including the grain, for example aluminum layer 600. In some examples, the aluminum layer 600 can predominantly include grains 602 that have a major surface dimension less than about 1 micron. In some examples, however, the aluminum layer 600 can include grains 602 having a major surface dimension less than about 2 microns, or less than about 3 microns. Although in other examples, the aluminum layer 600 can also include grains 604 having a major surface dimension greater than about 1, 2, or 3 microns, the aluminum layer 600 is predominantly formed from the smaller grains 602. Accordingly, the aluminum layer 600 can have a surface area ratio of grains 604 having a major surface dimension greater than 1 micron to grains 602 having a major surface dimension less than 1 micron. In some examples, this surface area ratio of large grains to small grains can be less than about 0.1, less than about 0.07, or even less than about 0.05. In some examples, the aluminum layer 600 can have a surface area ratio of grains 604 having a major surface dimension greater than 2 microns to grains 602 having a major surface dimension less than 2 microns of less than about 0.1, less than about 0.07, or less than about 0.05. In some examples, the aluminum layer 600 can have a surface area ratio of grains 604 having a major surface dimension greater than 3 microns to grains 602 having a major surface dimension less than 3 microns of less than about 0.1, less than about 0.07, or less than about 0.05.

In addition to aluminum, the aluminum layer 600 can include an amount of a grain refining material, also referred to as a grain refiner. A grain refiner can be used to promote the formation of grains having the desired dimension and properties described herein, for example, a major surface dimension less than 1 micron. In some examples, the aluminum layer 600 can include at least about 0.05 weight percent (wt %) of a grain refiner. In some examples, the aluminum layer 600 can include at least about 0.1 wt % of a grain refiner, at least about 0.2 wt %, at least about 0.3 wt %, at least about 0.4 wt %, at least about 0.5 wt % of a grain refiner, or even greater. In some examples, the aluminum layer 600 can include up to about 1 wt %, 5 wt %, or even up to about 10 wt % of a grain refiner. In some examples, the aluminum layer 600 can include about 0.4 wt % of a grain refiner. A number of different elements can be included as a grain refiner in the aluminum layer 600. For example, a grain refiner can include one or more of zirconium, scandium, silicon, or silver. Additional details of forming an aluminum layer on a substrate are provided below with reference to FIG. 7.

Figure 7:
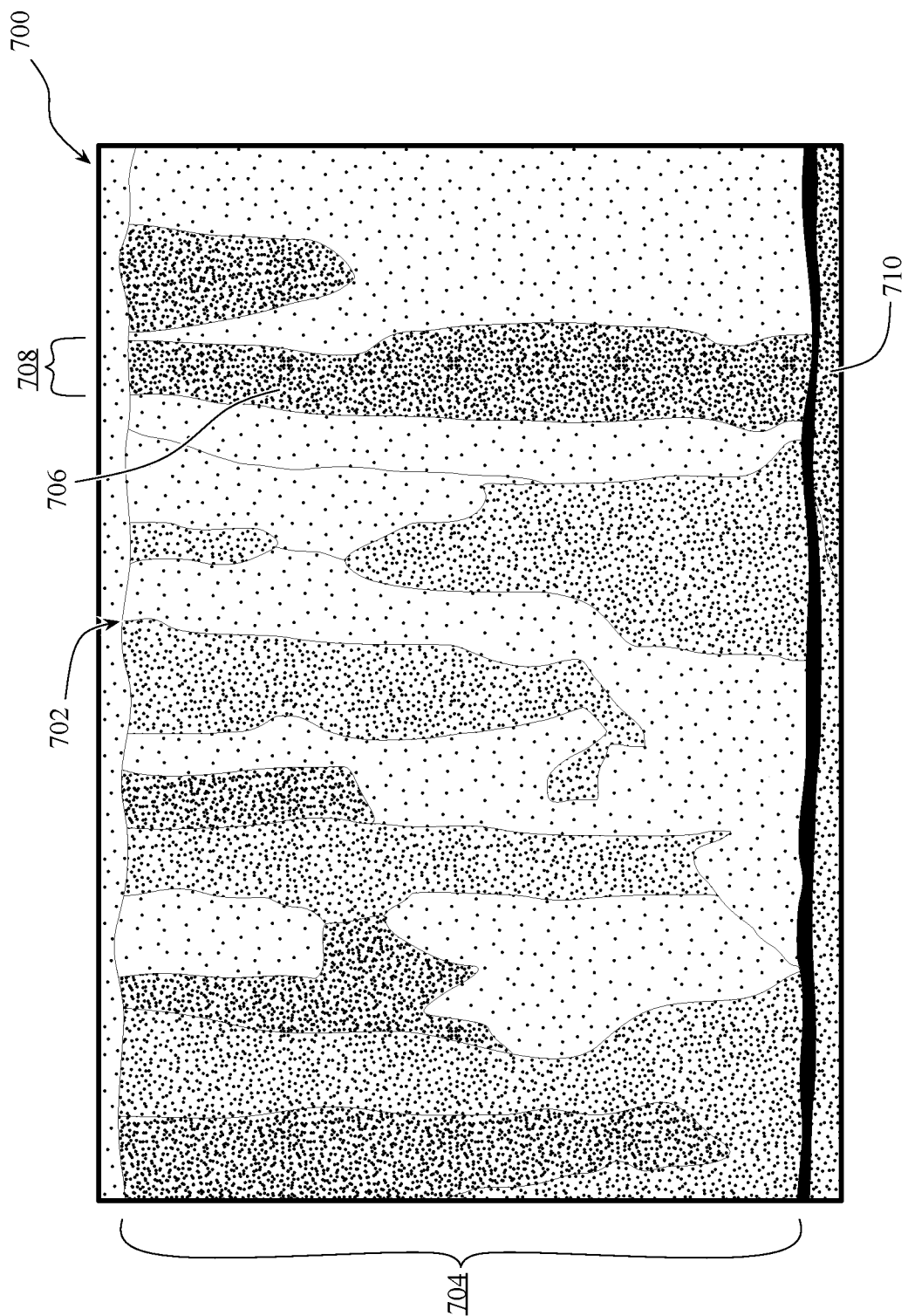
FIG. 7 illustrates a cross-sectional side view of the deposited aluminum layer of FIG. 6.

FIG. 7 shows a cross-sectional view of an aluminum layer 700 formed on a substrate 710 by a physical vapor deposition process, as described herein. The aluminum layer 700 can be substantially similar to the aluminum layer 600 described with respect to FIG. 6. The substrate 710 can be substantially similar to any of the substrates described herein, and can be, for example, similar to bands 102, 202, and 300. The aluminum layer 700 can include a surface 702 that can be similar to the surface of aluminum layer 600 shown in FIG. 6.

The aluminum layer 700 can have substantially any desired thickness 704. In some examples, however, the aluminum layer 700 can have a thickness 704 greater than about 2 microns. In some examples, the aluminum layer 700 can have a thickness 704 greater than about 5 microns, greater than about 10 microns, greater than about 15, 20, or 50 microns. In some examples, the aluminum layer 700 can have a thickness 704 up to about 100 microns, thus the aluminum layer 700 can have a thickness 704 between about 2 microns and about 100 microns.

As described previously with respect to FIG. 6, the aluminum layer 700 can predominantly include grains 706 having a major surface dimension 708 of less than about 1, 2, or 3 microns. In addition to having a large to small grain surface area ratio described above with respect to FIG. 6, the aluminum layer 700 can also have a desired amount of lateral density. The term lateral density, as used herein, can refer to the density (here defined as the ratio of the amount of material to the amount of open or vacant space) of a layer or film as measured in directions parallel to the surface of the substrate on which the layer is formed. For example, if a layer having a thickness is formed on the surface of a substrate, the lateral density is measured as the density in the directions orthogonal to the thickness or depth of the layer. The lateral density of a layer, such as aluminum layer 700, can be affected by the presence of gaps or voids between the grains forming the layer. Thus, when a layer is formed of grains that are not fully fused to adjacent grains, the lateral density of the layer will be reduced.

In some examples, the aluminum layer 700 can have a lateral density greater than about 98%, greater than about 98.5%, greater than about 99%, greater than about 99.5%, or greater than about 99.9% or greater. In some examples, the aluminum layer 700 can have a lateral density of about 100%. Accordingly, as shown in FIG. 7, the aluminum layer 700 can be formed from grains that are fully fused to substantially all neighboring or adjacent grains along substantially the entire thickness 704. That is, in some examples, the aluminum layer 700 can be a substantially continuous layer in all directions orthogonal to the thickness 704 of the aluminum layer 700.

As described herein, the size of the grains 706 forming the aluminum layer 700, as well as the lateral density and the surface area ratio of large to small grains of the aluminum layer 700 can impact the color of an anodized layer subsequently formed from the aluminum layer 700. Thus, in order to achieve an anodized layer having the desired values in the CIELAB color space, for example an L* value greater than about 85, an a* value of about 3, and a b* value between about 04 and about 4, the aluminum layer from which it is formed can have the microstructure of aluminum layers 600 and 700. Further details of forming an aluminum layer on a substrate are provided below with reference to FIGS. 8 and 9.

Figure 8:
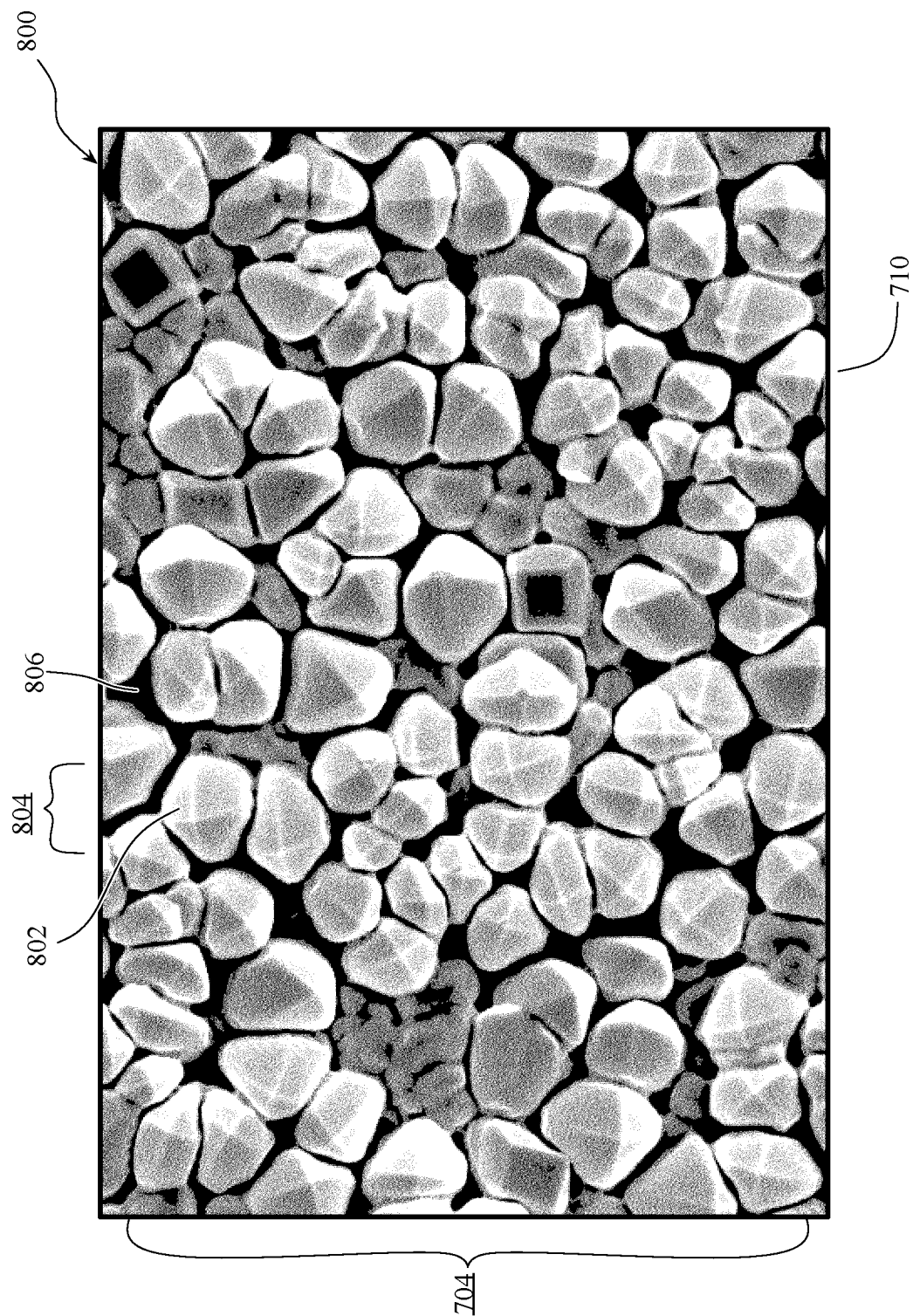
FIG. 8 illustrates the surface of a deposited aluminum layer.

FIG. 8 illustrates a view of a top surface of an aluminum layer 800 formed by a traditional deposition process, for example a process that does not include the presence of a grain refiner or that includes more or less than the amounts described herein. As can be seen, this aluminum layer 800 can be formed predominantly of grains such as grain 802 having a major surface dimension 804 greater than about 1, 2, or 3 microns. Further, the grains 802 are sometimes not fully fused to the adjacent or neighboring grains, leaving a number of gaps or voids 806 between the grains 802.

Figure 9:
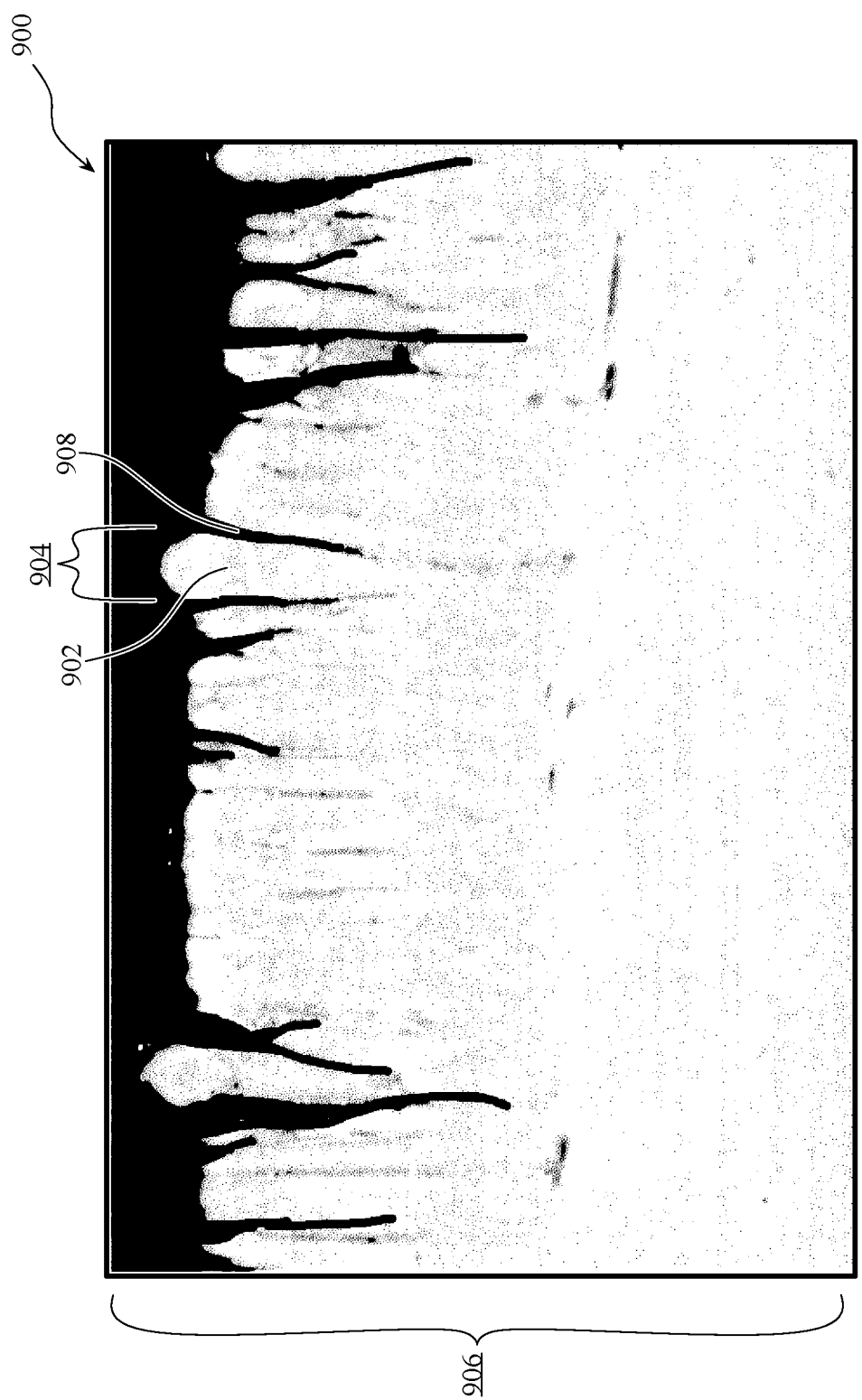
FIG. 9 illustrates a cross-sectional side view of the deposited aluminum layer of FIG. 8.

FIG. 9 illustrates a side view of an aluminum layer 900 formed by a traditional deposition process, for example a process that does not include the presence of a grain refiner or that includes more or less than the amounts described herein, similar to the aluminum layer 800. As with the aluminum layer 800, the aluminum layer 900 includes predominantly grains 902 having a major surface dimension 904 greater than about 1, 2, or 3 microns. Further, the surface area ratio of grains 902 having a major surface dimension 904 greater than 1 micron to grains having a major surface dimension less than 1 micron is greater than about 0.1, in this particular example, the surface area ratio is approximately 1.

Further, as seen in FIG. 9, the grains 902 are not fully fused to adjacent grains along the entire thickness 906 of the aluminum layer 900. Accordingly, the voids 908 present between the grains 902, can extend downward along the thickness 906 of the aluminum layer 900. As with the void 806 discussed with respect to FIG. 8, the voids 908 can result in the aluminum layer 900 having an insufficient lateral density to achieve a desired color and surface finish when anodized as described herein. In this example, the aluminum layer 900 has a lateral density significantly less than about 98%. As a result, upon anodization, the aluminum layer 900 would produce an anodized layer having large imperfections, due to the voids, and would have a dull and undesirable cosmetic appearance.

In some examples, when an aluminum layer is deposited by a physical vapor deposition process but does not include a grain refiner or includes an amount of grain refiner greater or less than the amounts described herein, the deposited aluminum layer can have some of all of the undesirable features and structures of aluminum layers 800 and 900, described with respect to FIGS. 8 and 9.

Any number or variety of electronic device components can include a surface coating, as described herein. The process for forming such a surface coating can include a physical vapor deposition process to deposit and aluminum layer on a surface of the component, and anodizing the aluminum layer, as described herein. An aluminum layer and a surface coating, as described herein, can be formed not only on the specific components and substrates described herein, but on any number of components in any combination. Various examples of aluminum layers, surface coatings, and processes for forming the same are described below with reference to FIG. 10.

Figure 10:
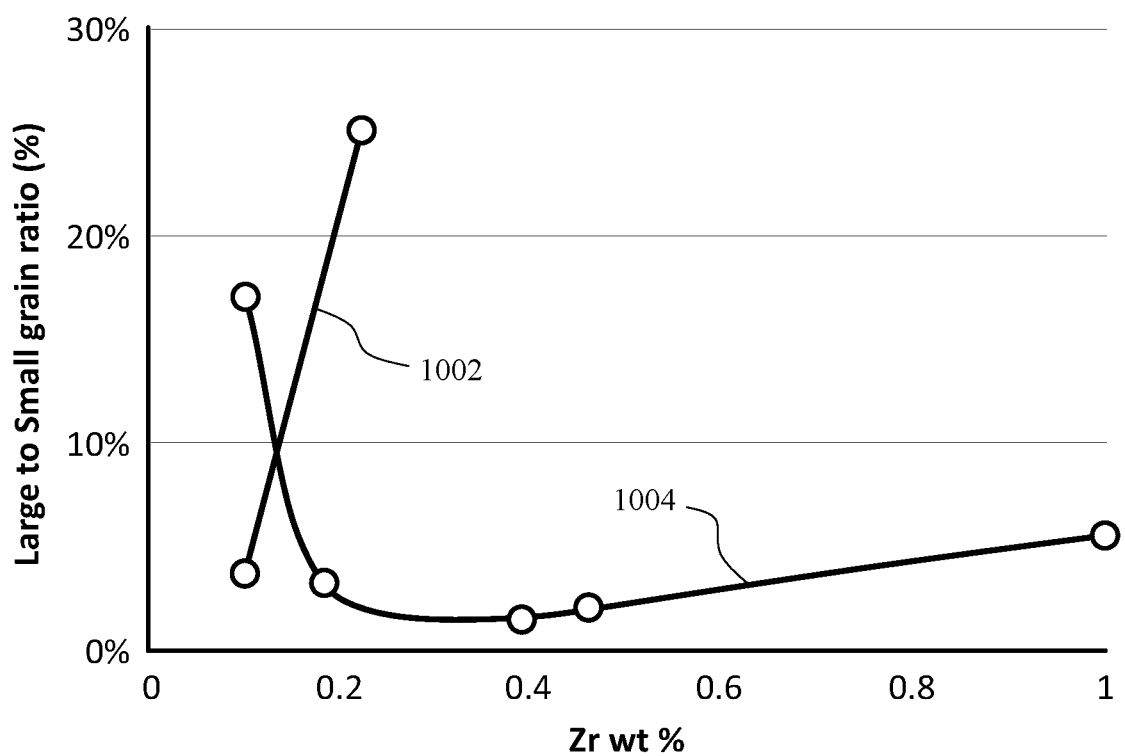
FIG. 10 shows a plot of grain refiner weight percentage versus grain size ratio for an aluminum layer deposited on different substrates.

FIG. 10 illustrates a plot of the weight percentage of a grain refiner in an aluminum layer deposited by a physical vapor deposition process, as described herein, versus grain surface area ratio for aluminum layers deposited on two different substrates 1002, 1004. As described, for example with respect to FIGS. 6-9, the amount of grain refiner in a deposited aluminum layer can affect the microstructure and properties of the aluminum layer.

Accordingly, in some examples, the amount of the grain refiner in a deposited aluminum layer can be varied to achieve a desired microstructure and set of layer properties. As described above with respect to FIG. 6, in some examples, the aluminum layer can include between about 0.05 wt % to about 5 wt % of a grain refiner. In some examples, however, the amount of grain refiner to achieve a desired microstructure and set of properties for the aluminum layer can vary depending on the substrate on which the aluminum layer is deposited.

In some examples, an aluminum layer as described herein can be deposited by a physical vapor deposition process on a substrate including substantially any conductive material. For example, an aluminum layer can be deposited on a substrate including metals, conductive ceramic materials, conductive polymer materials, and combinations thereof. As used herein, the term conductive refers to materials that are electrically conductive. Specifically, the term conductive is used herein to refer to materials having an electrical conductivity of greater than about 1 Siemen per meter (S/m) at about 20° C. In some examples, the processes described herein can achieve an aluminum layer having the desired properties described herein, such as a desired grain size surface area ratio, on substrates that are not suitable for traditional deposition processes.

In some examples, the substrate on which an aluminum layer is deposited, according to the processes described herein, can include a metal or metals. In some examples, the substrate can include metals such as titanium, aluminum, and/or steel, as well as alloys thereof. In some examples, an aluminum layer can be deposited on a substrate including substantially any aluminum alloy. For example, an aluminum layer can be deposited on a substrate including a 6000 series and/or 7000 series aluminum alloy, for example a 6063 or 7075 aluminum alloy. Accordingly, in some examples, an aluminum layer having the desired properties described herein can be deposited on a substrate including a recycled aluminum alloy.

Aluminum is generally a highly recyclable material, and as such, large amounts of aluminum alloys are routinely recycled and resold for further use, such as in electronic device manufacturing. The majority of this recycled aluminum is a 6063 aluminum alloy. Accordingly, in order to take advantage of the environmental and cost benefits associated with the use of recycled aluminum, the processes described herein can be used to deposit an aluminum layer on a substrate including a recycled 6063 aluminum alloy.

In some examples, the substrate onto which an aluminum layer is deposited or formed can include a conductive ceramic material. In some examples, the substrate can include substantially any conductive ceramic material. In some examples, the substrate can include a conductive oxide, for example a transparent conductive oxide such as indium tin oxide (ITO) and/or conductive silicon oxide materials. In some examples, the substrate can include a conductive polymer, such as polyacetylenes, and/or polypyrroles.

In some examples, the substrate on which an aluminum layer is deposited can take the form of, for example, any of the components described with respect to FIGS. 1-3. Accordingly, any of those components can include the substrate materials described herein, in any combination. For example, the substrate onto which an aluminum layer having the desired properties described herein is deposited can be substantially similar to bands 102, 202, and 300 and can include one or more of the conductive materials described herein in substantially any combination.

Referring again to FIG. 10, the effect of grain refiner weight percentage on grain size surface area ratio for aluminum layers deposited on two conductive substrates is shown. Sample aluminum layers were deposited on two substrates, the first substrate 1002 is a 2099 aluminum alloy, while the amount of grain refiner in each layer was varied. As can be seen, in order to achieve an aluminum layer surface area ratio of grains having a major surface dimension greater than 1 micron to grains having a major surface dimension less than 1 micron of less than about 0.1, it was found that the aluminum layer should include, for example, about 0.1 wt % of a grain refiner such as zirconium.

In contrast, for an aluminum layer deposited on a substrate 1004 including OZ13, it was found that that an aluminum layer having a grain size surface area ratio of less than about 0.1 could be achieved by including between about 0.2 wt % and about 1 wt %, or even greater, of a grain refiner such as zirconium. Further, while the inclusion of 0.1 wt % of a grain refiner in an aluminum layer deposited on the 2099 aluminum alloy substrate had a desired grain size surface area ratio, it can be seen that this amount of grain refiner in an aluminum layer deposited on the OZ13 substrate did not achieve a desired grain size area ratio.

Any number or variety of electronic device components can include a surface coating, as described herein. The process for forming such a surface coating can include a physical vapor deposition process to deposit and aluminum layer on a surface of the component, and anodizing the aluminum layer as described herein. An aluminum layer and a surface coating, as described herein, can be formed not only on the specific components and substrates described herein, but on any number of components in any combination. Various examples of aluminum layers, surface coatings, and processes for forming the same are described below with reference to FIGS. 11-12.

Figure 11:
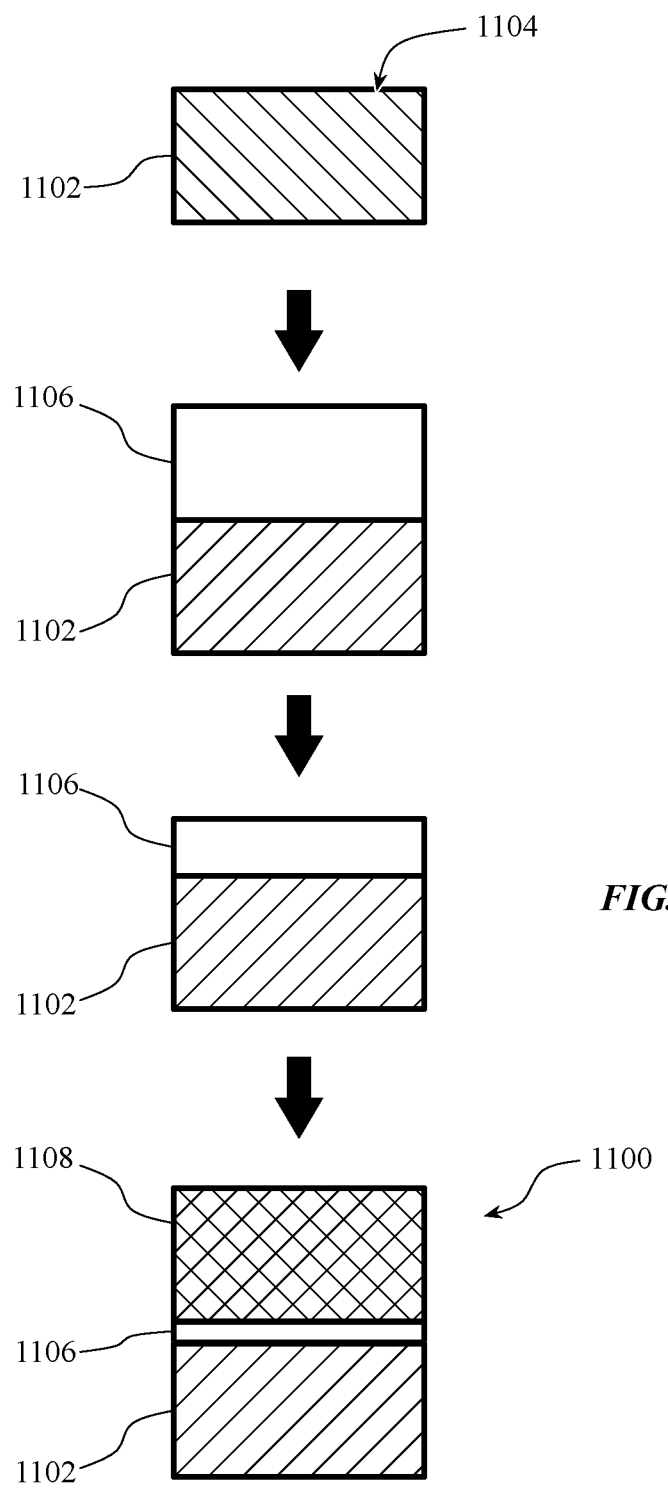
FIG. 11 shows stages of a process for forming a coating on a component of an electronic device.

FIG. 11 illustrates several stages of a process for forming or depositing a surface coating 1100 on a substrate 1102 by a process, as described herein. Initially, a substrate 1102 including a surface 1104 on which the surface coating 1100 is to be formed is provided. In some examples, the substrate 1102 can include any of the substrate materials described herein, for example, a conductive material such as a recycled aluminum alloy. Further, in some examples, the substrate 1102 can be a component for an electronic device, as described herein, for example a band such as bands 102, 202, 300. Although shown as a substantially planar surface, the surface 1104 onto which the surface coating 1100 is to be deposited can be a three-dimensional surface, as described herein.

In some examples, the substrate 1102, and specifically the surface 1104 can be subjected to processing prior to the formation of aluminum layer 1106 thereon. In some examples, the surface 1104 can be cleaned or subjected to other treatments prior to depositing an aluminum layer 1106, such as by chemical, mechanical, or other processes. In some examples, the surface 1104 can be subjected to processes to remove undesirable surface layers, contaminants, or other material therefrom. In some examples, the surface 1104 can be cleaned by etching or exposure to one or more chemical cleaning agents. For example, where the substrate 1102 includes aluminum, the surface 1104 can be etched, for example by a dry etching process, to remove or reduce the amount of any native aluminum oxide present on the surface 1104.

The aluminum layer 1106 is thus formed on the surface 1104 of the substrate 1102 by a physical vapor deposition process as described herein, for example including at least about 0.05 wt % of a grain refiner. In some examples, the formed aluminum layer 1106 can have the desired properties and microstructure described herein, for example, having a surface area ratio of grains having a major dimension greater than 1 micron to grains having a major surface dimension less than 1 micron of less than about 0.1, 0.07, or 0.05. Further, the aluminum layer 1106 can have a thickness greater than about 2 microns, for example, up to about 100 microns as desired.

The deposited aluminum layer 1106 can then be optionally subjected to one or more treatment processes, for example to provide a uniform and cosmetic surface for further treatment. In some examples, the deposited aluminum layer 1106 can be subjected to a treatment such as mechanical polishing, chemical polishing, or blasting. In some examples, these processes can reduce the thickness of the deposited aluminum layer 1106, however, these processes will not substantially negatively affect the microstructure and properties of the aluminum layer 1106 and will leave enough of the aluminum layer 1106 to form an anodized layer having a desired thickness, as described herein.

The optionally treated aluminum layer 1106 can then be subjected to an anodization process to convert at least a portion of the aluminum layer 1106 into an anodized aluminum oxide layer 1108, thereby forming the surface coating 1100. In some examples, the aluminum layer 1106 is not entirely consumed by the anodization process. Some amount of deposited aluminum layer 1106 can remain and be disposed below and directly adjacent to the anodized layer 1108. Thus, in some examples, the surface coating 1100 can include the anodized layer 1108 and at least a portion of the deposited aluminum layer 1106. In some examples, however, substantially all of the deposited aluminum layer 1106 can be consumed or converted into the anodized layer 1108, causing the surface coating 1100 to include only the anodized layer 1108.

In some examples, the anodized layer 1108 can have a thickness of at least about 4 microns, for example, a thickness up to about 200 microns. In some examples, the anodized layer 1108 can have a thickness that is approximately twice the thickness of the aluminum layer 1106 consumed to form the anodized layer 1108. Thus, in some examples, the anodized layer 1108 can have a thickness up to about twice the thickness of the deposited aluminum layer 1106 from which it is formed. In some examples, the anodized layer 1108 can have a thickness greater than about 4 microns, greater than about 10 microns, greater than about 20 microns, greater than about 30, 50, or 100 microns. In some examples, the anodized layer 1108 can have a thickness of about 200 microns. Thus, in some examples, the anodized layer 1108 can have a thickness between about 4 microns and about 200 microns.

In some examples, the anodized aluminum oxide layer 1108 can be or can include a substantially amorphous aluminum oxide material. In some examples, the anodized layer 1108 can be primarily formed of aluminum oxide ($Al_2O_3$), although in some examples, the anodized layer can include up to about 10 wt %, up to about 15 wt %, or even up to about 20 wt % of anions, such as sulfate ions, for example, from the electrolyte used to anodize the aluminum layer 1106. In some examples, the anodized layer 1108 can be porous and can have a porosity on the scale of nanometers, or tens of nanometers. The anodized layer 1108 can also include an amount of the grain refiner that was present in the aluminum layer 1106.

Further, as described herein, the anodized layer 1108 can have a desired color in the CIELAB color space. In the CIELAB color space, the lightness of the color is represented by the L* value, with an L* of zero being black and an L* of 100 being white. The a* value represents the green-red component of the color, with negative values being more green and positive values being more red, while the b* value represents the blue-yellow component, with negative values being more blue and positive values being more yellow.

In some examples, the anodized layer 1108 formed from at least some of the deposited aluminum layer 1106 having the properties and microstructure described herein can have a L* value greater than about 85. In some examples, the anodized layer 1108 can have a L* value greater than about 86, 87, 88, 89, 90, or even greater. As described herein, the microstructure and properties of the aluminum layer 1106 deposited by a physical vapor deposition process, as described herein, allow the anodized layer 1108 to achieve these desired L* values.

The anodized layer 1108 can be anodized by a process that can include the use of anodizing dyes and techniques, for example, as are known in the art or as can be developed in the future. As a result, the anodized layer 1108 can have substantially any desired a* and b* values if an appropriate dye and anodization process are used to form the layer. In some examples, however, the anodized layer 1108 can be formed by an anodization process that does not include a dye or coloring process. In these examples, the color of the formed anodized layer 1108 that does not include a dye can have an a* value of about 3 and a b* value between about −4 and about 4. Methods for forming a surface coating on a substrate are further detailed below, with reference to FIG. 12.

Figure 12:
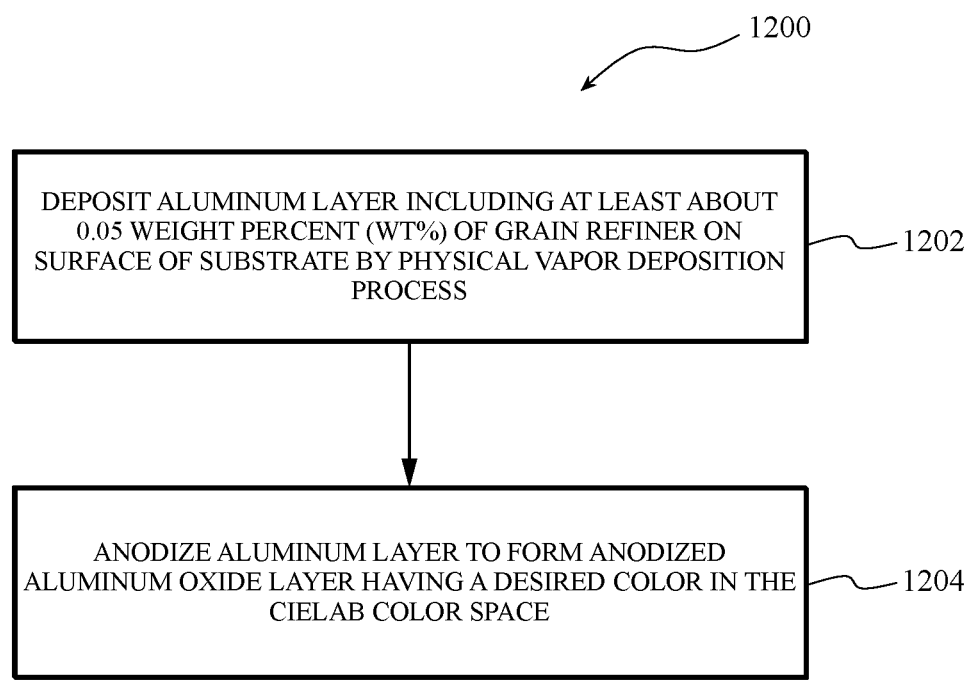
FIG. 12 shows a process flow diagram for a method of coating a component of an electronic device.

FIG. 12 illustrates a process flow diagram for a process 1200 of forming a surface coating on a substrate, for example, as illustrated with respect to FIG. 11. The process 1200 for forming the surface coating on a substrate can include depositing an aluminum layer including at least about 0.05 wt % of a grain refiner on a surface of the substrate by a physical vapor deposition process at block 1202 and anodizing the deposited aluminum layer to form an anodized aluminum oxide layer at block 1204.

At block 1202, an aluminum layer including at least about 0.05 wt % of a grain refiner is deposited on the surface of a substrate by a physical vapor deposition process, as described herein. In some examples, the substrate and/or substrate surface can be subjected to optional cleaning or surface preparation treatments prior to the deposition, for example to remove contaminants from the surface. In some examples, a surface treatment can include removing contaminants such as dirt, oils, or other matter from the surface, for example, by a exposing the surface to a cleaning agent, and/or by physically cleaning the surface. In some examples, a surface treatment can include etching the surface, for example by a wet or dry etching process, such as sputter etching. In some examples, the optional surface treatment can include removing some or all of any native oxide present on the surface of the substrate.

The aluminum layer deposited at block 1202 by a physical vapor deposition process can be substantially similar to the aluminum layers 600 and 700 described with respect to FIGS. 6 and 7. For example, the aluminum layer can have a surface area ratio of grains having a major surface dimension greater than 1 micron to grains having a major surface dimension less than 1 micron of less than about 0.1, less than about 0.07, or less than about 0.05. In some examples, the aluminum layer can have a lateral density greater than about 98%, greater than about 98.5%, greater than about 99%, greater than about 99.5%, greater than about 99.9%, or greater. In some examples, the aluminum layer can have a lateral density of about 100%. Further, in some examples, the aluminum layer can include at least about 0.1 wt % of a grain refiner, at least about 0.2 wt %, at least about 0.3 wt %, at least about 0.4 wt %, at least about 0.5 wt % of a grain refiner, or even greater. In some examples, the aluminum layer can include up to about 1 wt %, 5 wt %, or even up to about 10 wt % of a grain refiner. In some examples, the aluminum layer can include about 0.4 wt % of a grain refiner. A number of different elements can be included as a grain refiner in the aluminum layer. For example, a grain refiner can include one or more of zirconium, scandium, silicon, or silver.

At block 1204, at least some of the aluminum layer deposited at block 1202 is anodized to form an anodized aluminum oxide layer having a L* value greater than about 85. In some examples, the deposited aluminum layer can be subjected to additional processing prior to block 1204. For example, the surface of the deposited aluminum layer can be polished or blasted, as described with respect to FIG. 11. Anodization is an electrolytic process that converts material at or near the surface of the deposited aluminum layer to aluminum oxide and works downward through the thickness of the deposited aluminum layer. In some examples, the deposited aluminum layer can include a thin layer of natural aluminum oxide on the surface and the anodization process can increase the thickness of that natural layer by consuming or converting deposited aluminum. Thus, in some examples, the thickness of the anodized layer can be controlled by controlling the anodization process and the thickness of the deposited aluminum layer. As described herein, anodization can increase the thickness of the material being anodized, thus the anodized layer can have thickness up to about twice the thickness of the deposited aluminum layer. In some examples, the entire thickness of the aluminum layer is not anodized, and the anodized layer can be any of the thicknesses described with respect to anodized layer 1108 of FIG. 11. Further, the anodized layer formed by block 1204 can have any of the L*, a*, and/or b* values of anodized layer 1108, described with respect to FIG. 11. The formed anodized layer can then be subjected to any desired post formation processes.

Any number or variety of electronic device components can include a surface coating, as described herein. The process for forming such a surface coating can include a physical vapor deposition process to deposit and aluminum layer on a surface of the component and anodizing the aluminum layer as described herein. An aluminum layer and a surface coating, as described herein, can be formed not only on the specific components and substrates described herein, but on any number of components in any combination. Various examples of aluminum layers, surface coatings, and processes for forming the same are described below with reference to FIGS. 13-14.

Figure 13:
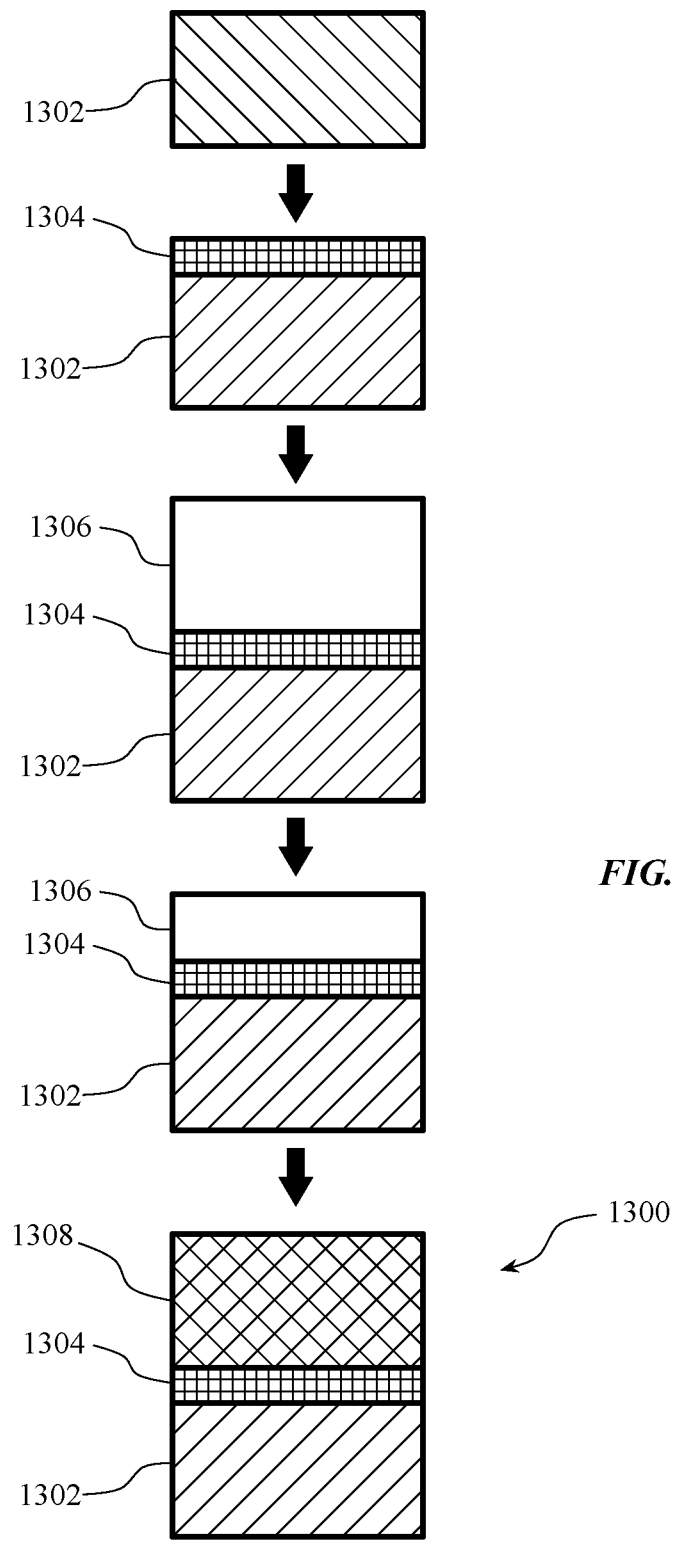
FIG. 13 shows stages of a process for forming a coating on a component of an electronic device.

FIG. 13 illustrates several stages of a process for forming or depositing a surface coating 1300 on a substrate 1302 by a process, as described herein. Initially, a substrate 1302 is provided. In some examples, the substrate 1302 can include any of the substrate materials described herein, for example, a conductive material such as a recycled aluminum alloy. Further, in some examples, the substrate 1302 can be a component for an electronic device, as described herein, for example a band such as bands 102, 202, 300.

In some examples, the substrate 1302 can be subjected to processing prior to the formation of any layers thereon. In some examples, the substrate 1302 can be cleaned or subjected to other treatments prior to depositing any layers thereon, such as by chemical, mechanical, or other processes. In some examples, the substrate 1302 can be subjected to processes to remove undesirable surface layers, contaminants, or other material therefrom. In some examples, the substrate 1302 can be cleaned by etching or exposure to one or more chemical cleaning agents. For example, where the substrate 1302 includes aluminum, the surface can be etched by a dry etching process to remove or reduce the amount of any native aluminum oxide present on the surface.

A stop layer 1304 can then be formed on a surface of the substrate 1302 by any desired process. Such a stop layer 1304 can allow for the substantially full anodization of any aluminum layer thereover without the expense or effort associated with the careful control and monitoring of the anodization process typically required to prevent anodization or oxidation of the substrate 1302. In some examples, the stop layer 1304 can include titanium, platinum group metals, or conductive oxide materials. In some examples, the stop layer 1304 can have any desired thickness, for example, up to about 1 micron, 500 nanometers, 100 nanometers, or even less.

The aluminum layer 1306 is then formed on the stop layer 1304 and over the substrate 1302 by a physical vapor deposition process, as described herein, for example, including at least about 0.05 wt % of a grain refiner. In some examples, the formed aluminum layer 1306 can have the desired properties and microstructure described herein, for example, having a surface area ratio of grains having a major dimension greater than 1 micron to grains having a major surface dimension less than 1 micron, of less than about 0.1, 0.07, or 0.05. Further, the aluminum layer 1306 can have a thickness greater than about 2 microns, for example, up to about 100 microns.

The deposited aluminum layer 1306 can then be optionally subjected to one or more treatment processes, for example, to provide a uniform and cosmetic surface for further treatment. In some examples, the deposited aluminum layer 1306 can be subjected to a treatment, such as mechanical polishing, chemical polishing, or blasting. In some examples, these processes can reduce the thickness of the deposited aluminum layer 1306, however these processes will not substantially negatively affect the microstructure and properties of the aluminum layer 1306 and will leave enough of the aluminum layer 1306 to form an anodized layer having a desired thickness, as described herein.

The optionally treated aluminum layer 1306 can then be subjected to an anodization process to convert at least a portion of the aluminum layer 1306 into an anodized aluminum oxide layer 1308, thereby forming the surface coating 1300. In some examples, the aluminum layer 1306 is not entirely consumed by the anodization process. Consequently, some amount of deposited aluminum layer 1306 can remain and be disposed below and directly adjacent to the anodized layer 1308. Thus, in some examples, the surface coating 1300 can include the anodized layer 1308, the stop layer 1304, and at least a portion of the deposited aluminum layer 1306. In some examples, however, substantially all of the deposited aluminum layer 1306, up to the stop layer 1304, can be consumed or converted into the anodized layer 1308 and the surface coating 1300 can include only the anodized layer 1308 and the stop layer 1304.

In some examples, the anodized layer 1308 can have a thickness of at least about 4 microns, for example a thickness up to about 200 microns. In some examples, the anodized layer 1308 can have a thickness that is approximately twice the thickness of the thickness of the aluminum layer 1106 consumed to form the anodized layer 1308. Thus, in some examples, the anodized layer 1308 can have a thickness up to about twice the thickness of the deposited aluminum layer 1106 from which it is formed. In some examples, the anodized layer 1308 can have a thickness greater than about 4 microns, greater than about 10 microns, greater than about 20 microns, greater than about 30, 50, or 100 microns. In some examples, the anodized layer 1308 can have a thickness of about 200 microns. Thus, in some examples, the anodized layer 1308 can have a thickness between about 4 microns and about 200 microns. Further, as described herein, the anodized layer 1308 can have a desired color in the CIELAB color space.

In some examples, the anodized layer 1308 formed from at least some of the deposited aluminum layer 1306 having the properties and microstructure described herein can have a L* value greater than about 85. In some examples, the anodized layer 1308 can have a L* value greater than about 86, 87, 88, 89, 90, or even greater. As described herein, the microstructure and properties of the aluminum layer 1306 deposited by a physical vapor deposition process allow the anodized layer 1308 to achieve these desired L* values.

In some examples, the anodized aluminum oxide layer 1308 can be or can include a substantially amorphous aluminum oxide material. In some examples, the anodized layer 1308 can be primarily formed of aluminum oxide ($Al_2O_3$), although in some examples, the anodized layer can include up to about 10 wt %, up to about 15 wt %, or even up to about 20 wt % of anions, such as sulfate ions, for example, from the electrolyte used to anodize the aluminum layer 1306. In some examples, the anodized layer 1308 can be porous and can have a porosity on the scale of nanometers, or tens of nanometers. The anodized layer 1308 can also include an amount of the grain refiner that was present in the aluminum layer 1306.

The anodized layer 1308 can be anodized by a process that can include the use of anodizing dyes and techniques, for example, as are known in the art, or as can be developed in the future. As a result, in some examples, the anodized layer 1308 can have substantially any desired a* and b* values if an appropriate dye and anodization process are used to form the layer. In some examples, however, the anodized layer 1308 can be formed by an anodization process that does not include a dye or coloring process. In these examples, the color of the formed anodized layer 1308 that does not include a dye can have an a* value of about 3 and a b* value between about −4 and about 4. Further details regarding forming a surface coating on a substrate are provided below, with reference to FIG. 14.

Figure 14:
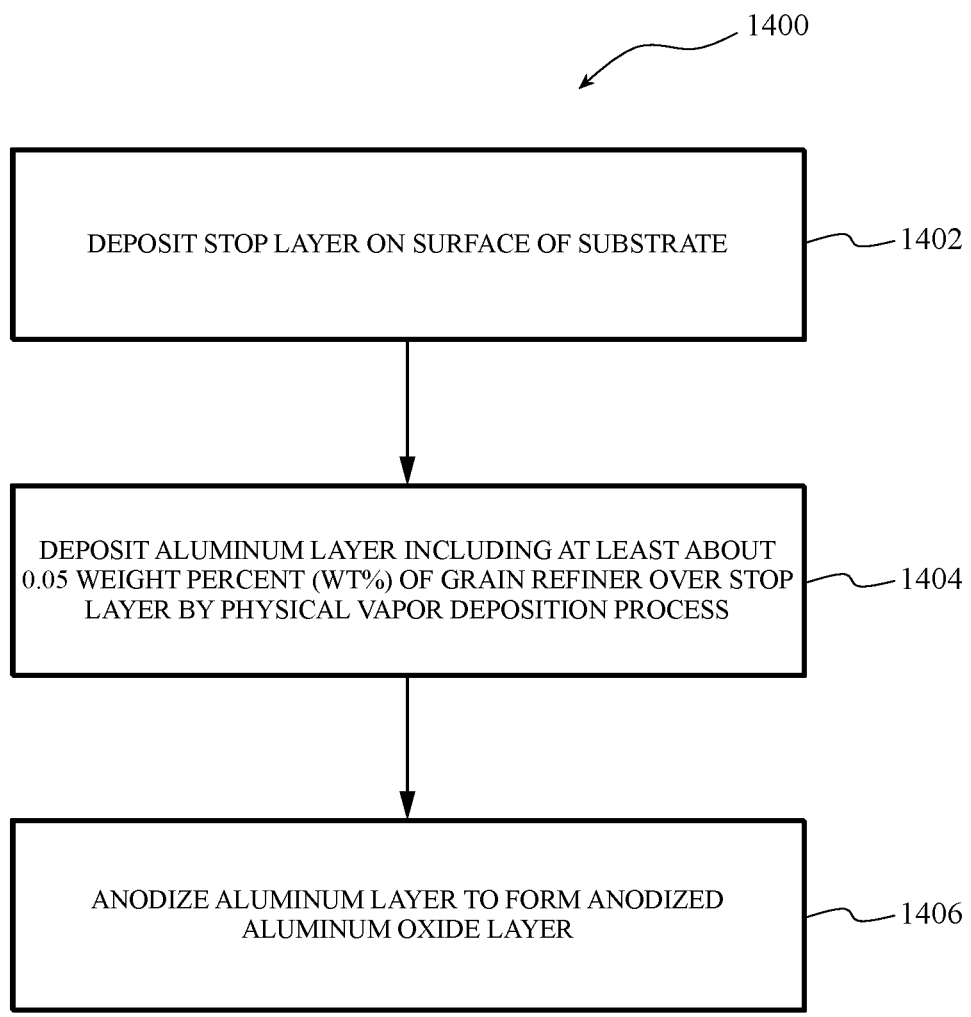
FIG. 14 shows a process flow diagram for a method of coating a component of an electronic device.

FIG. 14 illustrates a process flow diagram for a process 1400 of forming a surface coating on a substrate, for example, as illustrated with respect to FIG. 12. The process 1400 for forming the surface coating on a substrate can include depositing a stop layer having a thickness less than about 1 micron on the surface of the substrate at block 1402, depositing an aluminum layer including at least about 0.05 wt % of a grain refiner over the stop layer and the surface of the substrate by a physical vapor deposition process at block 1404 and anodizing the deposited aluminum layer to form an anodized aluminum oxide layer at block 1406.

At block 1402, a stop layer is formed on a surface of the substrate by any desired process. Such a stop layer can allow for the substantially full anodization of any aluminum layer thereover without the expense or effort associated with the careful control and monitoring of the anodization process typically required to prevent anodization or oxidation of the substrate. In some examples, the stop layer can include titanium, platinum group metals, or conductive oxide materials, and can be deposited or formed by any process known in the art or developed in the future, for example, a physical vapor deposition process such as a sputtering process, a chemical vapor deposition process, and other similar deposition process. In some examples, the stop layer can have any desired thickness, for example, up to about 1 micron, 500 nanometer, 100 nanometers, or even less.

At block 1404, an aluminum layer including at least about 0.05 wt % of a grain refiner is deposited on the surface of a substrate by a physical vapor deposition process, as described herein. In some examples, the substrate and/or substrate surface can be subjected to optional cleaning or surface preparation treatments to remove contaminants from the surface. In some examples, a surface treatment can include removing contaminants such as dirt, oils, or other matter from the surface by a exposing the surface to a cleaning agent, and/or by physically cleaning the surface. In some examples, a surface treatment can include etching the surface by a wet or dry etching process, such as sputter etching. In some examples, the optional surface treatment can include removing some or all of any native oxide present on the surface of the substrate.

The aluminum layer deposited at block 1404 by a physical vapor deposition process can be substantially similar to the aluminum layers 600 and 700 described with respect to FIGS. 6 and 7. For example, the aluminum layer can have a surface area ratio of grains having a major surface dimension greater than 1 micron to grains having a major surface dimension less than 1 micron of less than about 0.1, less than about 0.07, or less than about 0.05. In some examples, the aluminum layer can have a lateral density greater than about 98%, greater than about 98.5%, greater than about 99%, greater than about 99.5%, or greater than about 99.9% or greater. In some examples, the aluminum layer can have a lateral density of about 100%. Further, in some examples, the aluminum layer can include at least about 0.1 wt % of a grain refiner, at least about 0.2 wt %, at least about 0.3 wt %, at least about 0.4 wt %, at least about 0.5 wt % of a grain refiner or even greater. In some examples, the aluminum layer can include up to about 1 wt %, 5 wt %, or even up to about 10 wt % of a grain refiner. In some examples, the aluminum layer can include about 0.4 wt % of a grain refiner. A number of different elements can be included as a grain refiner in the aluminum layer. For example, a grain refiner can include one or more of zirconium, scandium, silicon, or silver.

At block 1404, at least some of the aluminum layer deposited at block 1404 is anodized to form an anodized aluminum oxide layer having an L* value greater than about 85. In some examples, substantially all of the aluminum layer is anodized to form the anodized aluminum oxide layer having a L* value greater than about 85. In some examples, the deposited aluminum layer can be subjected to additional processing prior to block 1406, for example, the surface of the deposited aluminum layer can be polished or blasted as described with respect to FIG. 13. In some examples, the thickness of the anodized layer can be controlled as desired by controlling the anodization process and the thickness of the deposited aluminum layer. As described herein, anodization can increase the thickness of the material being anodized. The anodized layer can, thus, have thickness up to about twice the thickness of the deposited aluminum layer. In some examples, the entire thickness of the aluminum layer is not anodized, and the anodized layer can be any of the thicknesses described with respect to anodized layer 1308 of FIG. 13. Further, the anodized layer formed by block 1406 can have any of the L*, a*, and/or b* values of anodized layer 1308 described with respect to FIG. 13. The formed anodized layer can then be subjected to any post formation processes as desired.

While the present disclosure generally describes deposited aluminum layers, anodized surface coatings, and processes for forming the same in the context of coating components for electronic devices, the layers, coatings, and processes described herein can be used on any desired substrate material or component in any combination and having any desired thickness. The layers and coatings described herein can be formed on surfaces having any desired geometric shape, pattern, size, or combination of shapes, patterns, and sizes. Additionally, in some examples, the aluminum layers described herein can be subjected to processes other than anodization as known in the art or as yet to be discovered.

As described above, one aspect of the present technology is the gathering and use of data available from various sources. The present disclosure contemplates that in some instances, this gathered data can include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. Further, other uses for personal information data that benefit the user are also contemplated by the present disclosure. For instance, health and fitness data can be used to provide insights into a user's general wellness or can be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data can be governed by federal and/or state laws, such as the Health Insurance Portability and Accountability Act (HIPAA); whereas health data in other countries can be subject to other regulations and policies and should be handled accordingly. Hence different privacy practices should be maintained for different personal data types in each country.

Despite the foregoing, the present disclosure also contemplates examples in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In addition to providing "opt in" and "opt out" options, the present disclosure contemplates providing notifications relating to the access or use of personal information. For instance, a user can be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification can be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed examples, the present disclosure also contemplates that the various examples can also be implemented without the need for accessing such personal information data. That is, the various examples of the present technology are not rendered inoperable due to the lack of all or a portion of such personal information data.

The terms exterior, outer, interior, inner, top, and bottom are used herein for reference purposes only. An exterior or outer portion of a composite component can form a portion of an exterior surface of the component but does not necessarily form the entire exterior of outer surface thereof. Similarly, the interior or inner portion of a composite component can form or define an interior or inner portion of the component but can also form or define a portion of an exterior or outer surface of the component. A top portion of a component can be located above a bottom portion in some orientations of the component, but can also be located in line with, below, or in other spatial relationships with the bottom portion depending on the orientation of the component.

As used herein, the term 'about' can refer to values within 10% of the particular value being modified by the term. In some examples, the term 'about' can refer to values within 10%, 5%, or even within 1% of the particular value being modified by the term 'about.' Thus, for example, the term 'about 10' can refer to any value between 9 and 11, inclusive of 9 and 11.

The terms 'different' and 'dissimilar' are used herein with respect to the comparison of materials to indicate that the materials do not have the same composition. That is, a first material and a second, different material are materials that do not have identical or substantially identical compositions or chemical makeups. In some cases, the terms 'different' and 'dissimilar' can refer to materials consisting of different elements or of the same elements in different amounts. For example, as used herein steel and aluminum are different materials. The terms 'different' and 'dissimilar' can also be used, however, to refer to various alloys of a material. For example, as used herein a 6061 aluminum alloy is a different or dissimilar material than a 7003 aluminum alloy.

Various inventions have been described herein with reference to certain specific examples. However, they will be recognized by those skilled in the art that many variations are possible without departing from the scope and spirit of the inventions disclosed herein, in that those inventions set forth in the claims below are intended to cover all variations and modifications of the inventions disclosed without departing from the spirit of the inventions. The terms "including:" and "having" come as used in the specification and claims shall have the same meaning as the term "comprising."

The foregoing description, for purposes of explanation, used specific nomenclature to provide a thorough understanding of the described examples. However, it will be apparent to one skilled in the art that the specific details are not required in order to practice the described examples. Thus, the foregoing descriptions of the specific examples described herein are presented for purposes of illustration and description. They are not meant to be exhaustive or to limit the examples to the precise forms disclosed. It will be apparent to one of ordinary skill in the art that many modifications and variations are possible in view of the above teachings.

What is claimed is:

1. A component for an electronic device, comprising:
    a substrate material defining a surface;
    an anodized aluminum oxide layer formed over the surface, the anodized aluminum oxide layer having a thickness greater than about 4 microns and an L* value in a CIELAB color space of greater than about 85; and
    a continuous stop layer disposed between the substrate material and the anodized aluminum oxide layer.

2. The component of claim 1, wherein the substrate material is a first material and the anodized aluminum oxide layer is formed from a second material different than the first material.

3. The component of claim 2, wherein the first material comprises an aluminum alloy.

4. The component of claim 1
    wherein the continuous stop layer comprises a thickness of less than about 1 micron;
    the continuous stop layer including titanium, platinum group metals, or a conductive oxide material.

5. The component of claim 1, further comprising:
    an aluminum layer disposed between the anodized aluminum oxide layer and the substrate, the aluminum layer having a thickness of less than about 100 microns and including at least about 0.05 weight percent (wt %) of a grain refiner;
    wherein the anodized aluminum oxide layer is formed from the aluminum layer.

6. The component of claim 1, wherein the anodized aluminum oxide layer has a b* value in the CIELAB color space of between about −0.04 and about 0.4.

7. The component of claim 1, wherein the surface comprises a three-dimensional surface.

8. The component of claim 1, wherein the anodized aluminum oxide layer comprises a thickness of less than about 200 microns.

9. A coating formed on a substrate material, comprising:
    an aluminum layer having grains with a major surface dimension greater than 1 micron and grains with a major surface dimension less than 1 micron, wherein a surface area ratio of grains with a major surface dimension greater than 1 micron to grains with a major surface dimension less than 1 micron, wherein the surface area ratio is less than about 0.1;
    the aluminum layer having a thickness greater than about 2 microns.

10. The coating of claim 9, wherein the thickness of the aluminum layer is less than about 100 microns.

11. The coating of claim 9, wherein the surface area ratio is less than about 0.07.

12. The coating of claim 9, wherein the surface area ratio is less than about 0.05.

13. The coating of claim 9, wherein the aluminum layer comprises greater than about 0.05 weight percent (wt %) of a grain refiner.

14. The coating of claim 13, wherein the grain refiner comprises at least one of zirconium, scandium, silicon, or silver.

* * * * *